US012166329B2

United States Patent
Jiang et al.

(10) Patent No.: US 12,166,329 B2
(45) Date of Patent: Dec. 10, 2024

(54) HIGH VOLTAGE PULSE GENERATION DEVICE, GAS LASER APPARATUS, AND ELECTRONIC DEVICE MANUFACTURING METHOD

(71) Applicants: National University Corporation Nagaoka University of Technology, Niigata (JP); Gigaphoton Inc., Tochigi (JP)

(72) Inventors: Weihua Jiang, Nagaoka (JP); Hiroshi Umeda, Oyama (JP); Koji Kakizaki, Oyama (JP)

(73) Assignees: National University Corporation Nagaoka University of Technology, Niigata (JP); Gigaphoton Inc., Tochigi (JP)

( * ) Notice: Subject to any disclaimer, the term of this patent is extended or adjusted under 35 U.S.C. 154(b) by 743 days.

(21) Appl. No.: 17/396,928

(22) Filed: Aug. 9, 2021

(65) Prior Publication Data
US 2021/0367393 A1 Nov. 25, 2021

Related U.S. Application Data

(63) Continuation of application No. PCT/JP2019/012901, filed on Mar. 26, 2019.

(51) Int. Cl.
*H01S 3/13* (2006.01)
*H01S 3/091* (2006.01)
(Continued)

(52) U.S. Cl.
CPC ........ *H01S 3/09702* (2013.01); *H01S 3/0912* (2013.01); *H01S 3/0971* (2013.01);
(Continued)

(58) Field of Classification Search
CPC ............... H01S 3/09702; H01S 3/0912; H01S 3/0971; H01S 3/0973; H01S 3/0975;
(Continued)

(56) References Cited

U.S. PATENT DOCUMENTS 4,295,103 A * 10/1981 Ljudmirsky .......... H01S 3/0975
372/56
2002/0186739 A1* 12/2002 Sandstrom .............. H01S 3/223
372/55
(Continued)

FOREIGN PATENT DOCUMENTS

CN 106532412 A 3/2017
JP 2001-217492 A 8/2001
(Continued)

OTHER PUBLICATIONS

International Search Report issued in PCT/JP2019/012901; mailed Jun. 25, 2019.
International Preliminary Report On Patentability and Written Opinion issued in PCT/JP2019/012901; issued Sep. 28, 2021.

*Primary Examiner* — Kinam Park
(74) *Attorney, Agent, or Firm* — Studebaker & Brackett PC

(57) ABSTRACT

A high voltage pulse generation device includes n transformer cores configuring a transformer, n being a natural number of 2 or more, each of the n transformer cores being configured to form a magnetic circuit along a first plane and to have a width in a first direction parallel to the first plane larger than a width in a second direction parallel to the first plane and perpendicular to the first direction; n primary electric circuits of the transformer connected in parallel to each other, each of the n primary electric circuits including at least one primary coil, and m pulse generation units connected in parallel to the at least one primary coil, m being a natural number equal to or more than 2; and a secondary (Continued)

electric circuit of the transformer including a secondary coil and connected to a pair of discharge electrodes.

20 Claims, 12 Drawing Sheets

(51) Int. Cl.
  *H01S 3/097* (2006.01)
  *H01S 3/0971* (2006.01)
  *H01S 3/0973* (2006.01)
  *H01S 3/0975* (2006.01)
  *H01S 3/131* (2006.01)
  *G03F 7/00* (2006.01)
  *G03F 7/20* (2006.01)
  *H01F 27/24* (2006.01)
  *H01F 27/28* (2006.01)
  *H01S 3/225* (2006.01)

(52) U.S. Cl.
  CPC .......... *H01S 3/0973* (2013.01); *H01S 3/0975* (2013.01); *H01S 3/1312* (2013.01); *G03F 7/2006* (2013.01); *G03F 7/70025* (2013.01); *G03F 7/70041* (2013.01); *H01F 27/24* (2013.01); *H01F 27/28* (2013.01); *H01S 3/225* (2013.01); *H01S 3/2251* (2013.01); *H01S 3/2256* (2013.01)

(58) Field of Classification Search
  CPC ...... H01S 3/1312; H01S 3/225; H01S 3/2251; H01S 3/2256
  See application file for complete search history.

(56) References Cited

U.S. PATENT DOCUMENTS

| | | | |
|---|---|---|---|
| 2005/0088855 A1* | 4/2005 | Kirchmeier | H02M 7/53871 363/17 |
| 2015/0255948 A1* | 9/2015 | Von Bergmann | H01F 30/16 372/38.03 |
| 2016/0190763 A1* | 6/2016 | Kakizaki | H01S 3/225 372/38.05 |
| 2016/0359291 A1* | 12/2016 | Asayama | G03F 7/70025 |
| 2017/0338618 A1* | 11/2017 | Jiang | H01S 3/225 |
| 2021/0367394 A1* | 11/2021 | Jiang | H01S 3/1312 |

FOREIGN PATENT DOCUMENTS

| | | |
|---|---|---|
| JP | 2004-064935 A | 2/2004 |
| JP | 2005-347586 A | 12/2005 |
| JP | 2006-324039 A | 11/2006 |
| JP | 2016-506616 A | 3/2016 |
| WO | 2016/152738 A1 | 9/2016 |

\* cited by examiner

HIGH VOLTAGE PULSE GENERATION DEVICE, GAS LASER APPARATUS, AND ELECTRONIC DEVICE MANUFACTURING METHOD

CROSS-REFERENCE TO RELATED APPLICATIONS

The present application claims the benefit of International Application No. PCT/JP2019/012901, filed on Mar. 26, 2019, the entire contents of which are hereby incorporated by reference.

BACKGROUND

1. Technical Field

The present disclosure relates to a high voltage pulse generation device, a gas laser apparatus, and an electronic device manufacturing method.

2. Related Art

Improvement in resolution of a semiconductor exposure apparatus has been desired for miniaturization and high integration of semiconductor integrated circuits. Hereinafter, a semiconductor exposure apparatus is simply referred to as an "exposure apparatus." For this purpose, an exposure light source that outputs light having a shorter wavelength has been developed. As the exposure light source, a gas laser apparatus is used in place of a conventional mercury lamp. As a gas laser apparatus for exposure, a KrF excimer laser apparatus that outputs ultraviolet light having a wavelength of 248 nm and an ArF excimer laser apparatus that outputs ultraviolet light having a wavelength of 193 nm are currently used.

As current exposure technology, immersion exposure is practically used in which a gap between a projection lens of an exposure apparatus and a wafer is filled with a liquid and a refractive index of the gap is changed to reduce an apparent wavelength of light from an exposure light source. When the immersion exposure is performed using the ArF excimer laser apparatus as the exposure light source, the wafer is irradiated with ultraviolet light having a wavelength of 134 nm in water. This technology is referred to as ArF immersion exposure. The ArF immersion exposure is also referred to as ArF immersion lithography.

Since the KrF excimer laser apparatus and the ArF excimer laser apparatus have a large spectral line width of about 350 to 400 pm in natural oscillation, chromatic aberration of laser light (ultraviolet light), which is reduced and projected on a wafer by a projection lens of an exposure apparatus, occurs to deteriorate resolution. Then, a spectral line width of laser light output from the gas laser apparatus needs to be narrowed to the extent that the chromatic aberration can be ignored. The spectral line width is also referred to as a spectral width. For this purpose, a line narrowing module (LNM) having a line narrowing element is provided in a laser resonator of the gas laser apparatus to narrow the spectral width. The line narrowing element may be an etalon, a grating, or the like. A laser apparatus with such a narrowed spectral width is referred to as a line narrowing laser apparatus.

LIST OF DOCUMENTS

Patent Documents

Patent Document 1: US Patent Application Publication No. 2017/0338618

Patent Document 2: Japanese Patent Application Publication No. 2006-324039

SUMMARY

A high voltage pulse generation device according to an aspect of the present disclosure, for applying a pulse high voltage between a pair of discharge electrodes arranged in a laser chamber of a gas laser apparatus, may include n transformer cores configuring a transformer, n being a natural number of 2 or more, each of the n transformer cores being configured to form a magnetic circuit along a first plane and to have a width in a first direction parallel to the first plane larger than a width in a second direction parallel to the first plane and perpendicular to the first direction; n primary electric circuits of the transformer connected in parallel to each other, each of the n primary electric circuits including at least one primary coil, and m pulse generation units connected in parallel to the at least one primary coil, m being a natural number equal to or more than 2; and a secondary electric circuit of the transformer including a secondary coil and connected to the pair of discharge electrodes.

A gas laser apparatus according to an aspect of the present disclosure may include a laser chamber, a pair of discharge electrodes arranged in the laser chamber, and a high voltage pulse generation device configured to apply a pulse high voltage between the pair of discharge electrodes. Here, the high voltage pulse generation device includes n transformer cores configuring a transformer, n being a natural number of 2 or more, each of the n transformer cores being configured to form a magnetic circuit along a first plane and to have a width in a first direction parallel to the first plane larger than a width in a second direction parallel to the first plane and perpendicular to the first direction; n primary electric circuits of the transformer connected in parallel to each other, each of the n primary electric circuits including at least one primary coil, and m pulse generation units connected in parallel to the at least one primary coil, m being a natural number equal to or more than 2; and a secondary electric circuit of the transformer including a secondary coil and connected to the pair of discharge electrodes.

An electronic device manufacturing method according to an aspect of the present disclosure may include generating pulse laser light using a gas laser apparatus, emitting the pulse laser light to an exposure apparatus, and exposing a photosensitive substrate to the pulse laser light in the exposure apparatus to manufacture an electronic device. Here, the gas laser apparatus includes a laser chamber, a pair of discharge electrodes arranged in the laser chamber, and a high voltage pulse generation device configured to apply a pulse high voltage between the pair of discharge electrodes. The high voltage pulse generation device includes n transformer cores configuring a transformer, n being a natural number of 2 or more, each of the n transformer cores being configured to form a magnetic circuit along a first plane and to have a width in a first direction parallel to the first plane larger than a width in a second direction parallel to the first plane and perpendicular to the first direction; n primary electric circuits of the transformer connected in parallel to each other, each of the n primary electric circuits including at least one primary coil, and m pulse generation units connected in parallel to the at least one primary coil, m being a natural number equal to or more than 2; and a secondary electric circuit of the transformer including a secondary coil and connected to the pair of discharge electrodes.

BRIEF DESCRIPTION OF THE DRAWINGS

Embodiments of the present disclosure will be described below merely as examples with reference to the accompanying drawings.

DESCRIPTION OF EMBODIMENTS

Figure 1:
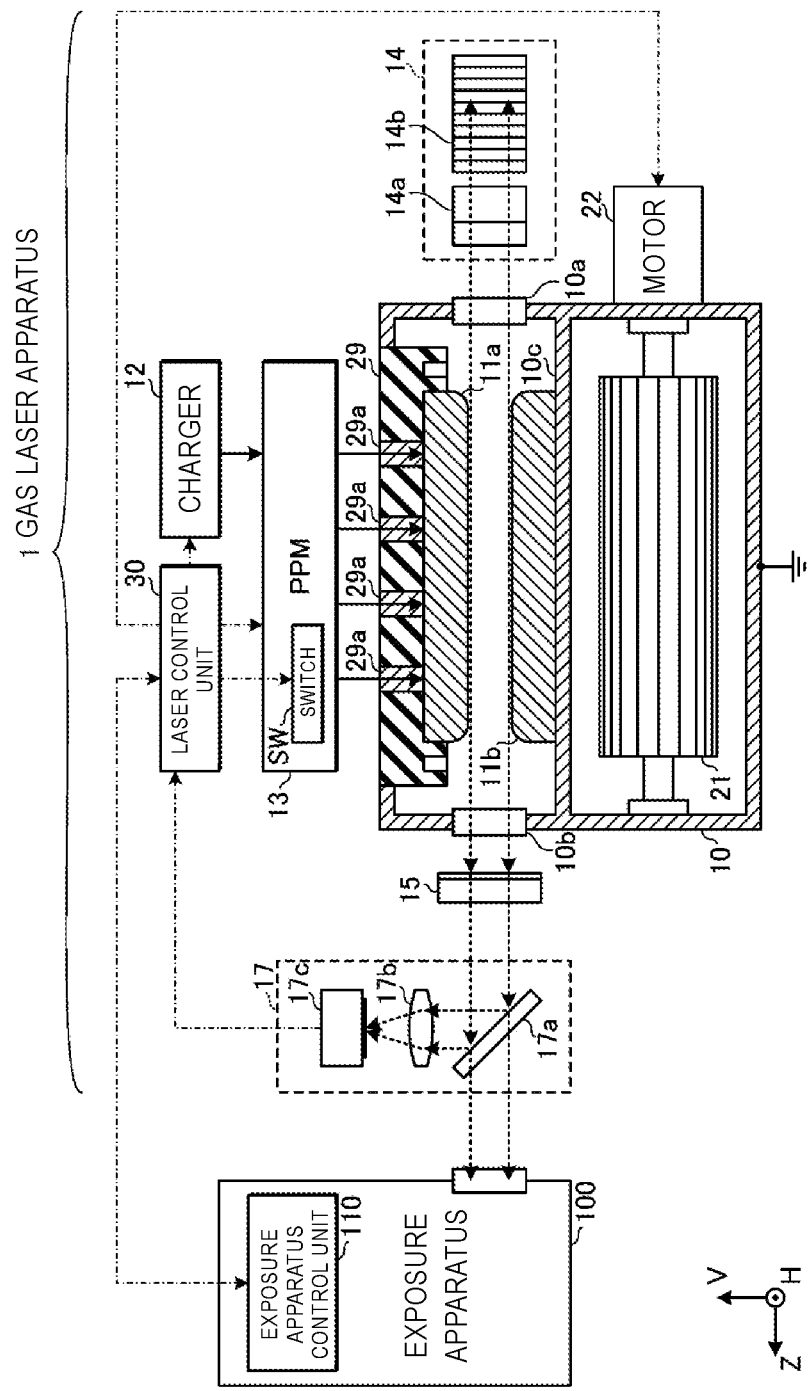
FIG. 1 schematically shows the configuration of a gas laser apparatus 1 according to a comparative example.

<Contents>
1. Comparative example
   1.1 Configuration of gas laser apparatus
   1.2 Operation of gas laser apparatus
   1.3 Configuration of pulse power module
      1.3.1 Primary electric circuit
      1.3.2 Secondary electric circuit
   1.4 Operation of pulse power module
   1.5 Operation of laser control unit
      1.5.1 Main flow
      1.5.2. Detail of drive timing setting processing
         1.5.2.1 Primary electric circuit driven at time T1
         1.5.2.2 Primary electric circuit driven at time T2
         1.5.2.3 Primary electric circuit driven at time T3
         1.5.2.4 Primary electric circuit not to be driven
      1.5.3 Time chart
   1.6 Arrangement on substrate
   1.7 Structure in which n primary electric circuits are laminated
   1.8 Problem
2. Pulse power module having transformer core elongated in Z direction
   2.1 Configuration of transformer core
   2.2 Configuration of secondary coil
   2.3 Configuration of m pulse generation units
   2.4 Effect
3. Pulse power module with increased number of pulse generation units
   3.1 Configuration
   3.2 Effect
4. Pulse power module including trigger input unit
   4.1 Arrangement of elements
   4.2 Circuit configuration
   4.3 Effect
5. Pulse power module including many trigger input units
6. Pulse power module including divided substrate
7. Others Hereinafter, embodiments of the present disclosure will be described in detail with reference to the drawings. The embodiments described below show some examples of the present disclosure and do not limit the contents of the present disclosure. Also, all configurations and operation described in the embodiments are not necessarily essential as configurations and operation of the present disclosure. Here, the same components are denoted by the same reference numerals, and duplicate description thereof is omitted.

1. Comparative Example 1.1 Configuration of Gas Laser Apparatus

FIG. 1 schematically shows the configuration of a gas laser apparatus 1 according to a comparative example. FIG. 1 shows the internal configuration of the gas laser apparatus 1 viewed from a direction substantially perpendicular to a discharge direction between a pair of discharge electrodes 11a, 11b and substantially perpendicular to the travel direction of laser light output from an output coupling mirror 15. The travel direction of the laser light output from the output coupling mirror 15 is represented by the +Z direction. The discharge direction between the discharge electrodes 11a, 11b is represented by the +V direction or the −V direction. The direction perpendicular to the both is represented by the +H direction or the −H direction. The Z direction corresponds to the first direction in the present disclosure. The H direction corresponds to the second direction in the present disclosure. The −V direction substantially coincides with the direction of gravity.

The gas laser apparatus 1 is used together with an exposure apparatus 100. Laser light emitted from the gas laser apparatus 1 is incident on the exposure apparatus 100. The exposure apparatus 100 includes an exposure apparatus control unit 110. The exposure apparatus control unit 110 is configured to control the exposure apparatus 100. The exposure apparatus control unit 110 is configured to transmit setting data and an oscillation trigger signal of target pulse energy Et to a laser control unit 30 included in the gas laser apparatus 1.

The gas laser apparatus 1 includes a laser chamber 10, a charger 12, a pulse power module 13, a line narrowing module 14, the output coupling mirror 15, an energy monitor 17, a crossflow fan 21, a motor 22, and the laser control unit 30. The gas laser apparatus 1 is, for example, an excimer laser apparatus. The laser control unit 30 controls the entire gas laser apparatus 1.

The laser chamber 10 is arranged on an optical path of a laser resonator configured by the line narrowing module 14 and the output coupling mirror 15. The laser chamber 10 is provided with two windows 10a, 10b. The laser chamber 10 accommodates the discharge electrodes 11a, 11b. The laser chamber 10 contains laser gas as a laser medium. The laser gas includes, for example, argon gas, fluorine gas, and neon gas. Alternatively, the laser gas includes, for example, krypton gas, fluorine gas, and neon gas.

An opening is formed in a part of the laser chamber 10, which is closed by an electrically insulating portion 29. The electrically insulating portion 29 supports the discharge electrode 11a. A plurality of conductive portions 29a are embedded in the electrically insulating portion 29. Each of the conductive portions 29a is electrically connected to the discharge electrode 11a.

A return plate 10c is arranged in the laser chamber 10. A conductive member of the laser chamber 10 is electrically connected to the return plate 10c. The return plate 10c supports the discharge electrode 11b. The return plate 10c is electrically connected to the discharge electrode 11b. Between the laser chamber 10 and the return plate 10c, gaps (not shown) through which the laser gas passes are provided on the front and back sides of the sheet of FIG. 1.

The crossflow fan 21 is arranged in the laser chamber 10. A rotation axis of the crossflow fan 21 is connected to the motor 22 arranged outside the laser chamber 10. The motor 22 rotates the crossflow fan 21. Thus, the laser gas circulates in the laser chamber 10.

The charger 12 holds electric energy to be supplied to the pulse power module 13. The pulse power module 13 includes a switch SW. The charger 12 is connected to the pulse power module 13. The pulse power module 13 is connected to the discharge electrode 11a through the conductive portions 29a.

The line narrowing module 14 includes wavelength selection elements such as a prism 14a and a grating 14b. Instead of the line narrowing module 14, a high reflection mirror may be used. The output coupling mirror 15 is configured by a partial reflection mirror.

The energy monitor 17 includes a beam splitter 17a, a light concentrating lens 17b, and a light sensor 17c. The beam splitter 17a is arranged in the optical path of the laser light output from the output coupling mirror 15. The beam splitter 17a is configured to transmit a part of the laser light output from the output coupling mirror 15 toward the exposure apparatus 100 at high transmittance and to reflect the other part. The light concentrating lens 17b and the light sensor 17c are arranged in the optical path of the laser light reflected by the beam splitter 17a.

1.2 Operation of Gas Laser Apparatus

The laser control unit 30 receives the setting data of the target pulse energy Et and the oscillation trigger signal from the exposure apparatus control unit 110. The laser control unit 30 transmits a setting signal of a charge voltage to the charger 12 based on the setting data of the target pulse energy Et received from the exposure apparatus control unit 110. Further, the laser control unit 30 transmits the oscillation trigger signal received from the exposure apparatus control unit 110 to the pulse power module 13.

When the pulse power module 13 receives the oscillation trigger signal from the laser control unit 30, the pulse power module 13 generates a pulse high voltage from the electric energy charged in the charger 12 and applies the high voltage between the discharge electrodes 11a, 11b.

When the high voltage is applied between the discharge electrodes 11a, 11b, discharge occurs between the discharge electrodes 11a, 11b. The laser gas in the laser chamber 10 is excited by the energy of the discharge and shifts to a high energy level. When the excited laser gas then shifts to a low energy level, light having a wavelength corresponding to the difference between the energy levels is emitted.

The light generated in the laser chamber 10 is emitted to the outside of the laser chamber 10 through the windows 10a, 10b. The beam width of the light emitted through the window 10a of the laser chamber 10 is expanded by the prism 14a, and then the light is incident on the grating 14b. The light incident on the grating 14b from the prism 14a is reflected by a plurality of grooves of the grating 14b and is diffracted in a direction corresponding to a wavelength of the light. The grating 14b is disposed in the Littrow arrangement, which causes the incident angle of the light incident on the grating 14b from the prism 14a to coincide with the diffraction angle of the diffracted light having a desired wavelength. Thus, light having a wavelength close to the desired wavelength returns into the laser chamber 10 via the prism 14a.

The output coupling mirror 15 transmits and outputs a part of the light emitted from the window 10b of the laser chamber 10, and reflects the other part back into the laser chamber 10.

In this way, the light emitted from the laser chamber 10 reciprocates between the line narrowing module 14 and the output coupling mirror 15. This light is amplified every time it passes through a discharge space between the discharge electrodes 11a, 11b. Further, this light is line narrowed each time it is turned back in the line narrowing module 14. Thus, the light having undergone laser oscillation and line narrowing is output as laser light from the output coupling mirror 15.

The light concentrating lens 17b included in the energy monitor 17 concentrates the laser light reflected by the beam splitter 17a on the light sensor 17c. The light sensor 17c transmits an electric signal corresponding to pulse energy of the laser light concentrated by the light concentrating lens 17b to the laser control unit 30 as measurement data.

The laser control unit 30 receives the measurement data from the energy monitor 17. The laser control unit 30 performs feedback control of the charge voltage set to the charger 12 based on the measurement data of the pulse energy received from the energy monitor 17 and the setting data of the target pulse energy Et received from the exposure apparatus control unit 110.

1.3 Configuration of Pulse Power Module

Figure 2:
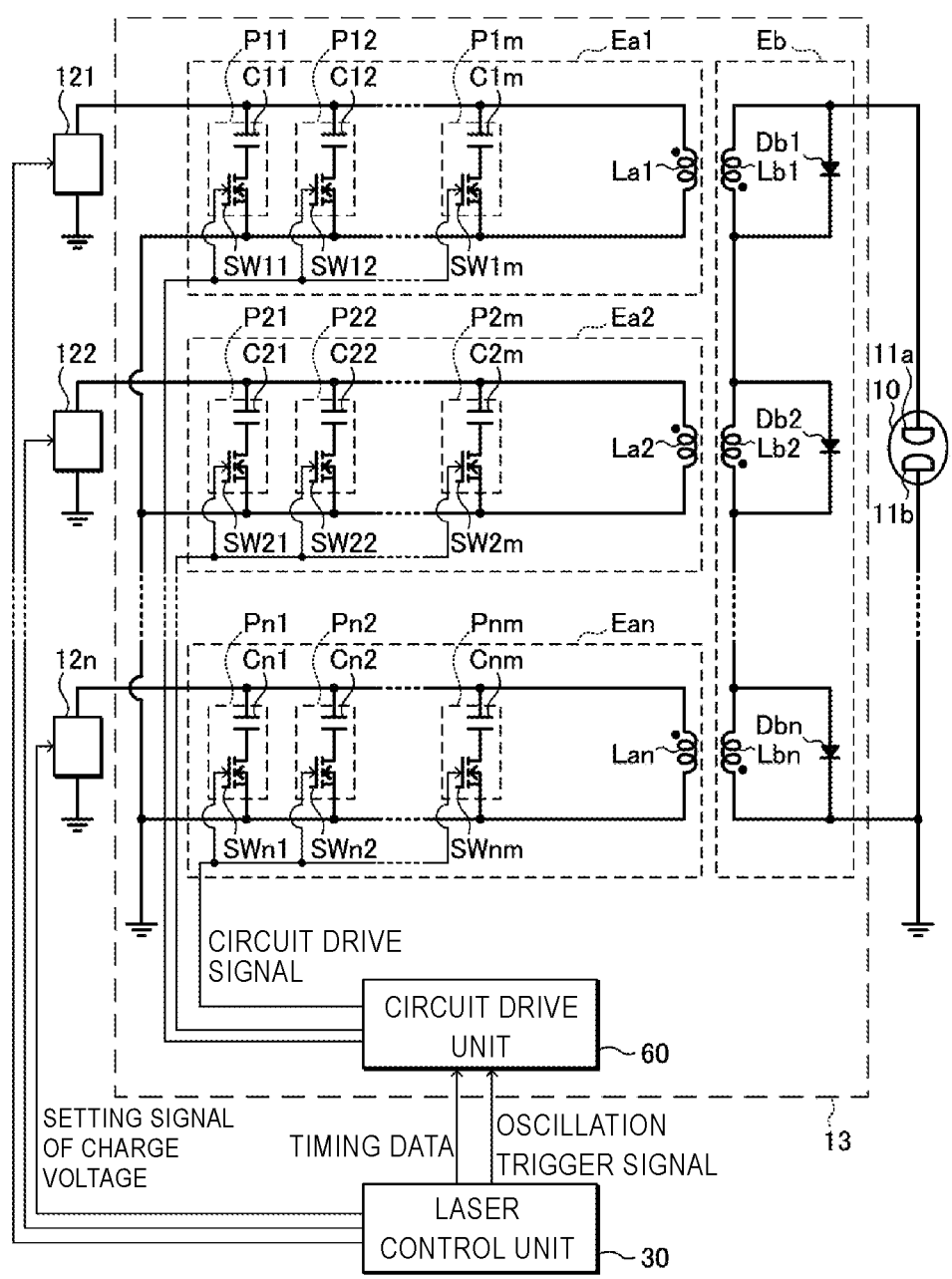
FIG. 2 shows an electric circuit of a pulse power module 13 shown in FIG. 1.

FIG. 2 shows an electric circuit of the pulse power module 13 shown in FIG. 1 The pulse power module 13 of the comparative example includes n primary electric circuits Ea1 to Ean, a secondary electric circuit Eb, and a circuit drive unit 60. The pulse power module 13 is a pulse compression circuit configured by a linear transformer driver (LTD). The pulse power module 13 is connected to the laser control unit 30 through a signal line.

1.3.1 Primary Electric Circuit

The charger 12 described with reference to FIG. 1 is configured by n chargers 121 to 12n as shown in FIG. 2. The n chargers 121 to 12n are connected to the n primary electric circuits Ea1 to Ean, respectively. Here, n is a natural number equal to or more than 2 and is, for example, a natural number in the range of 15 to 30. Each charger 12i of the n chargers 121 to 12n is a DC power supply device. Here, i is an arbitrary natural number equal to or more than 1 and equal to or less than n. In the present disclosure, n components X1 to Xn may be distinguished from each other by assigning numbers 1 to n to the reference signs of n components X. Also, the reference sign Xi may substitute for referring to one of the n components X1 to Xn. When one of n components Y1 to Yn different from the n components X1 to Xn is substituted by the reference sign Yi, it is indicated that the component Xi and the component Yi have a correspondence relationship therebetween. Each primary electric circuit Eai of the n primary electric circuits Ea1 to Ean has one terminal connected to a reference potential and the other terminal connected to the charger 12$i$. That is, the n primary electric circuits Ea1 to Ean are connected in parallel to each other. Note that the reference potential is, for example, a ground potential.

The n chargers 121 to 12$n$ are connected to the laser control unit 30 through signal lines.

The primary electric circuit Eai includes a primary coil Lai and m pulse generation units Pi1 to Pim. That is, the n primary electric circuits Ea1 to Ean include n primary coils La1 to Lan and n×m pulse generation units each indicated by the reference sign Pij. Here, m is a natural number equal to or more than 2 and is, for example, a natural number in the range of 15 to 30. Further, j is an arbitrary natural number equal to or more than 1 and equal to or less than m. In the present disclosure, m components X1 to Xm may be distinguished from each other by assigning numbers 1 to m to the reference signs of m components X. Also, the reference sign Xj may substitute for referring to one of the m components X1 to Xm. When one of m components Y1 to Ym different from the m components X1 to Xm is substituted by the reference sign Yj, it is indicated that the component Xj and the component Yj have a correspondence relationship therebetween. In the present disclosure, n×m components X11 to Xnm may be distinguished from each other by assigning numbers 11 to nm to the reference signs of n×m components X. Also, the reference sign Xij may substitute for referring to one of the n×m components X11 to Xnm. When one of n×m components Y11 to Ynm different from the n×m components X11 to Xnm is substituted by the reference sign Yij, it is indicated that the component Xij and the component Yij have a correspondence relationship therebetween.

The pulse generation unit Pij includes a capacitor Cij and a switch SWij. The capacitor Cij and the switch SWij are connected in series.

In the primary electric circuit Eai, m pulse generation units Pi1 to Pim are connected in parallel to each other. Further, the primary coil Lai is connected in parallel to the m pulse generation units Pi1 to Pim. Among the terminals at both ends of the primary coil Lai, one terminal is connected to the reference potential and the other terminal is connected to an output terminal of the charger 12$i$. Among the terminals at both ends of the pulse generation unit Pij, the terminal located on the switch SWij side is connected to the reference potential and the terminal located on the capacitor Cij side is connected to the output terminal of the charger 12$i$.

The switch SWij is configured by, for example, a metal-oxide-semiconductor field-effect transistor (MOSFET). A drain terminal of the MOSFET configuring the switch SWij is connected to one terminal of the capacitor Cij. A source terminal of the MOSFET is connected to the reference potential. A gate terminal of the MOSFET is connected to the circuit drive unit 60 through a signal line.

Here, n signal lines are connected to the circuit drive unit 60. The n signal lines are connected to the n primary electric circuits Ea1 to Ean, respectively. Each of the n signal lines branches into m signal lines. The m signal lines are connected to m switches Swi1 to SWim included in the primary electric circuit Eai, respectively. That is, the m signal lines are connected to m gate terminals of the m MOSFETs, respectively.

1.3.2 Secondary Electric Circuit

One terminal of the secondary electric circuit Eb is connected to the discharge electrode 11$a$. The other terminal of the secondary electric circuit Eb and the discharge electrode 11$b$ are both connected to the reference potential.

The secondary electric circuit Eb includes n secondary coils Lb1 to Lbn and n diodes Db1 to Dbn. The n secondary coils Lb1 to Lbn are connected in series to each other. The n diodes Db1 to Dbn are connected in parallel to the n secondary coils Lb1 to Lbn, respectively.

A transformer is configured of the n primary coils La1 to Lan, the n secondary coils Lb1 to Lbn, and n transformer cores TC1 to TCn (see FIG. 6A to FIG. 9B). The n transformer cores TC1 to TCn and each transformer core TCi will be described later.

1.4 Operation of Pulse Power Module

The laser control unit 30 transmits a setting signal of the charge voltage to then chargers 121 to 12$n$. A charge voltage ΔV set to each of the n chargers 121 to 12$n$ is, for example, substantially the same value. The charge voltage ΔV is, for example, a voltage having a positive potential with respect to the reference potential. The charge voltage ΔV may be, for example, about 1 kV. Each charger 12$i$ of the n chargers 121 to 12$n$ charges the m capacitors Ci1 to Cim included in the primary electric circuit Eai with the charge voltage ΔV.

The laser control unit 30 outputs timing data and the oscillation trigger signal to the circuit drive unit 60. The timing data defines drive timing of each of the n primary electric circuits Ea1 to Ean. The timing data may include information defining, among the n primary electric circuits Ea1 to Ean, which primary electric circuit is to be driven and which primary electric circuit is not to be driven. The number of the primary electric circuits to be driven among the n primary electric circuits Ea1 to Ean and the breakdown thereof may be determined based on the target pulse energy Et of pulse laser light to be emitted from the gas laser apparatus 1.

The circuit drive unit 60 transmits a circuit drive signal to the primary electric circuit Eai based on the timing data and the oscillation trigger signal. The circuit drive signal is input substantially simultaneously to the m switches SWi1 to SWim included in the primary electric circuit Eai. When the m switches SWi1 to SWim are switched from an off state to an on state substantially simultaneously, pulse currents flow substantially simultaneously from the m capacitors Ci1 to Cim. The pulse current flowing from the m capacitors Ci1 to Cim flows into the primary coil Lai. In the primary coil Lai, the pulse current flows downward from the upper side of FIG. 2. The pulse current flowing through the primary coil Lai generates a magnetic flux at the transformer core TCi described later, and the generation of the magnetic flux generates an induced electromotive force at the secondary coil Lbi.

Due to the generation of the induced electromotive force at the secondary coil Lbi, a pulse voltage is applied between the pair of discharge electrodes 11$a$, 11$b$. When the ratio of the number of turns of the primary coil Lai to the number of turns of the secondary coil Lbi is 1, the induced electromotive force generated at the secondary coil Lbi is substantially equal to the charge voltage ΔV of the charger 12$i$. When the number of the primary electric circuits that are driven simultaneously among the n primary electric circuits Ea1 to Ean is large, the number of the secondary coils in which the induced electromotive force is generated simultaneously among the n secondary coils Lb1 to Lbn becomes large. For example, when the number of the primary electric circuits that are driven simultaneously among the n primary electric circuits Ea1 to Ean is i, the voltage applied between the pair of discharge electrodes 11a, 11b is $i \cdot \Delta V$.

When the voltage is applied between the pair of discharge electrodes 11a, 11b and dielectric breakdown occurs, discharge occurs between the pair of discharge electrodes 11a, 11b and the pulse current flows in the secondary electric circuit Eb. When the primary coil Lai and the secondary coil Lbi are opposite in phase to each other as shown in FIG. 2, the pulse current flows downward from the upper side of FIG. 2 at the secondary coil Lbi. When the discharge occurs, the laser gas is excited and pulse laser light is generated.

Here, for example, when the primary electric circuit Ea1 is not driven and the remaining n−1 primary electric circuits Ea2 to Ean are driven, the induced electromotive force is generated simultaneously at the n−1 secondary coils Lb2 to Lbn. When the diode Db1 is not arranged, a large pulse current also flows in the remaining secondary coil Lb1 connected in series to the n−1 secondary coils Lb2 to Lbn. The pulse current flowing in the secondary coil Lb1 generates a magnetic flux at the transformer core TC1 described later, and the generation of the magnetic flux generates an induced electromotive force at the primary coil La1. Due to the induced electromotive force generated at the primary coil La1, a voltage is applied to the m switches SW11 to SW1m in the off state included in the primary electric circuit Ea1, which may damage these switches SW11 to SWim. A voltage is also applied to the charger 121 by the induced electromotive force generated at the primary coil La1, which may damage the charger 121. The diode Db1 is arranged to suppress damage to the switches SW11 to SWim and the charger 121. That is, even when an induced electromotive force is generated at any of the n−1 secondary coils Lb2 to Lbn, the current flows in the diode Db1, so that the current is suppressed from flowing in the secondary coil Lb1.

The same applies to the diodes Db2 to Dbn. That is, even when an induced electromotive force is generated at any of the secondary coils other than one secondary coil Lbi among the n secondary coils Lb1 to Lbn, the current flows in the diode Dbi, so that the current is suppressed from flowing in the secondary coil Lbi.

1.5 Operation of Laser Control Unit
1.5.1 Main Flow

Figure 3:
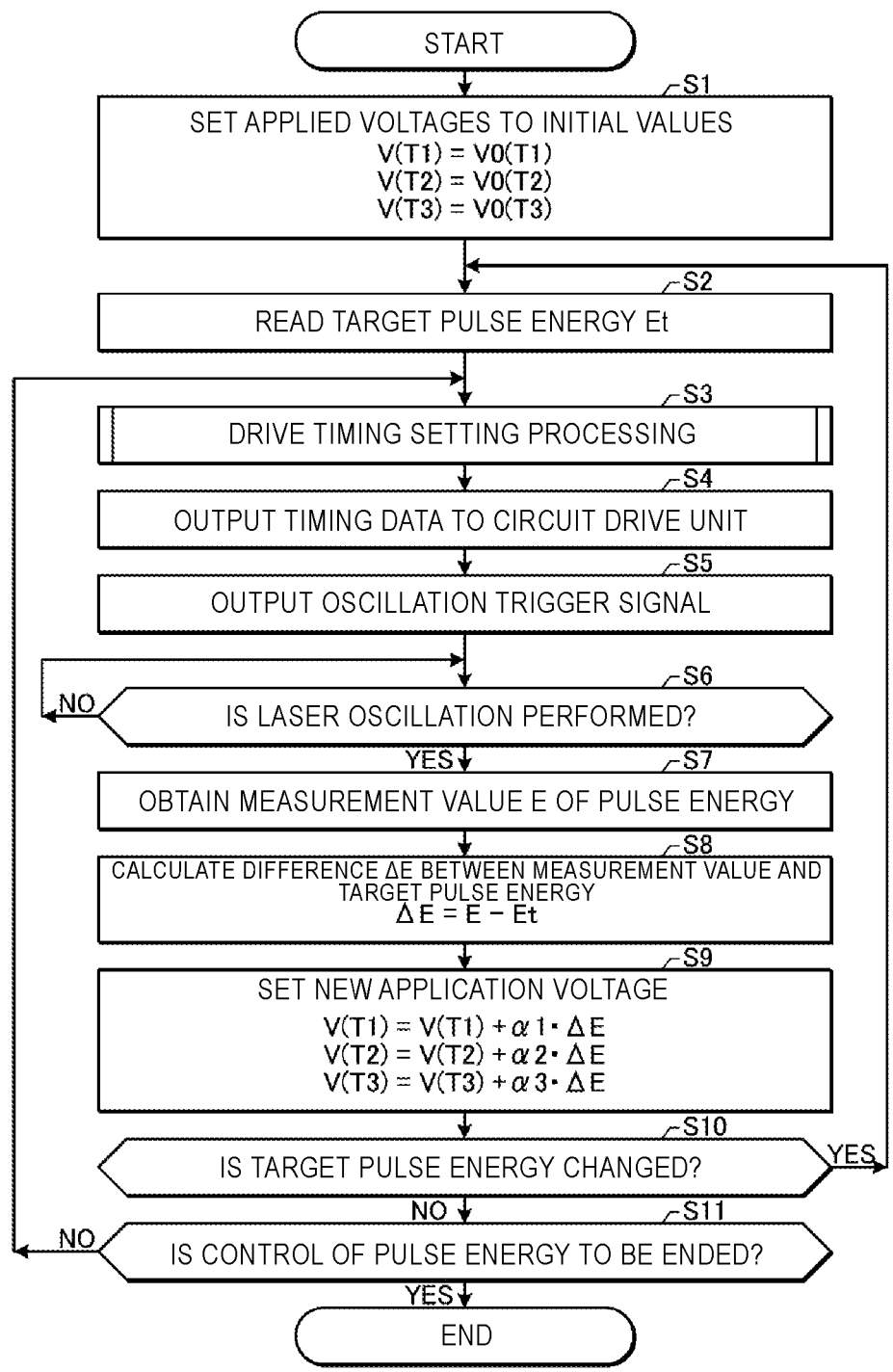
FIG. 3 is a flowchart showing processing of a laser control unit 30 for controlling pulse energy of pulse laser light.

FIG. 3 is a flowchart showing processing of the laser control unit 30 for controlling the pulse energy of the pulse laser light.

In S1, the laser control unit 30 sets application voltages V(T1), V(T2), V(T3) to be applied between the pair of discharge electrodes 11a, 11b as follows.

V(T1)=V0 (T1)
V(T2)=V0 (T2)
V(T3)=V0 (T3)

The application voltages V(T1), V(T2), V(T3) are to be applied between the pair of discharge electrodes 11a, 11b at timing delayed from the oscillation trigger signal by times T1, T2, T3, respectively. Here, V0(T1), V0(T2), and V0(T3) are initial values of the application voltages V(T1), V(T2), V(T3), respectively.

The times T1 to T3 have the following relationship.

$$T1 < T2 < T3$$

The time T3 is a time within which the discharge necessary for emitting the pulse laser light having desired pulse energy can be continued.

Among the application voltages V(T1), V(T2), V(T3), for example, the application voltage V(T1) has the maximum absolute value. The application voltage V(T1) is set to a voltage at which at least the laser gas between the pair of discharge electrodes 11a, 11b causes dielectric breakdown to occur and main discharge can be started. The application voltages V(T2), V(T3) are each set to a voltage at which the main discharge started by the application voltage V(T1) can be continued.

In S2, the laser control unit 30 reads the target pulse energy Et set by the exposure apparatus control unit 110.

In S3, the laser control unit 30 performs drive timing setting processing. The drive timing setting processing is processing of creating timing data by setting the drive timing of each of the n primary electric circuits Ea1 to Ean. Details of the drive timing setting processing will be described later with reference to FIG. 4.

In S4, the laser control unit 30 outputs the timing data created in S3 to the circuit drive unit 60.

In S5, the laser control unit 30 outputs the oscillation trigger signal received from the exposure apparatus control unit 110 to the circuit drive unit 60. The circuit drive unit 60 controls driving of the n primary electric circuits Ea1 to Ean based on the timing data and the oscillation trigger signal. Specifically, the circuit drive unit 60 may drive the primary electric circuits to be driven among the n primary electric circuits Ea1 to Ean at the timing delayed by the times T1, T2, T3 respectively from the oscillation trigger signal. The number of the primary electric circuits to be driven among the n primary electric circuits Ea1 to Ean and breakdown thereof will be described later with reference to FIG. 4.

In S6, the laser control unit 30 determines whether laser oscillation is performed. When laser oscillation is performed, the laser control unit 30 waits until laser oscillation is performed. When laser oscillation is performed, the laser control unit 30 proceeds to S7.

In S7, the laser control unit 30 obtains a measurement value E of the pulse energy measured by the energy monitor 17.

In S8, the laser control unit 30 calculates a difference $\Delta E$ between the measurement value E of the pulse energy and the target pulse energy Et. The difference $\Delta E$ is calculated using the following equation.

$$\Delta E = E - Et$$

In S9, the laser control unit 30 sets new application voltages V(T1), V(T2), V(T3) so that the difference $\Delta E$ approaches 0. The new application voltages V(T1), V(T2), V(T3) are set using the following equations.

$$V(T1) = V(T1) + \alpha 1 \cdot \Delta E$$

$$V(T2) = V(T2) + \alpha 2 \cdot \Delta E$$

$$V(T3) = V(T3) + \alpha 3 \cdot \Delta E$$

Here, $\alpha 1$, $\alpha 2$, and $\alpha 3$ on the right sides may be proportional constants obtained in advance by experiments or the like.

In S10, the laser control unit 30 determines whether the target pulse energy Et is changed. The exposure apparatus control unit 110 may change the target pulse energy Et. In this case, the exposure apparatus control unit 110 outputs setting data of the changed target pulse energy Et to the laser control unit 30.

When the target pulse energy Et is changed (S10: YES), the laser control unit 30 returns to S2. When the target pulse energy Et is not changed (S10: NO), the laser control unit 30 proceeds to S11.

In S11, the laser control unit 30 determines whether to end the processing of controlling the pulse energy of the pulse laser light. When the processing of controlling the pulse energy of the pulse laser light is not to be ended (S11: NO), the laser control unit 30 returns to S3. When the processing of controlling the pulse energy of the pulse laser light is to be ended (S11: YES), the laser control unit 30 ends the processing of the present flowchart.

1.5.2. Detail of Drive Timing Setting Processing

Figure 4:
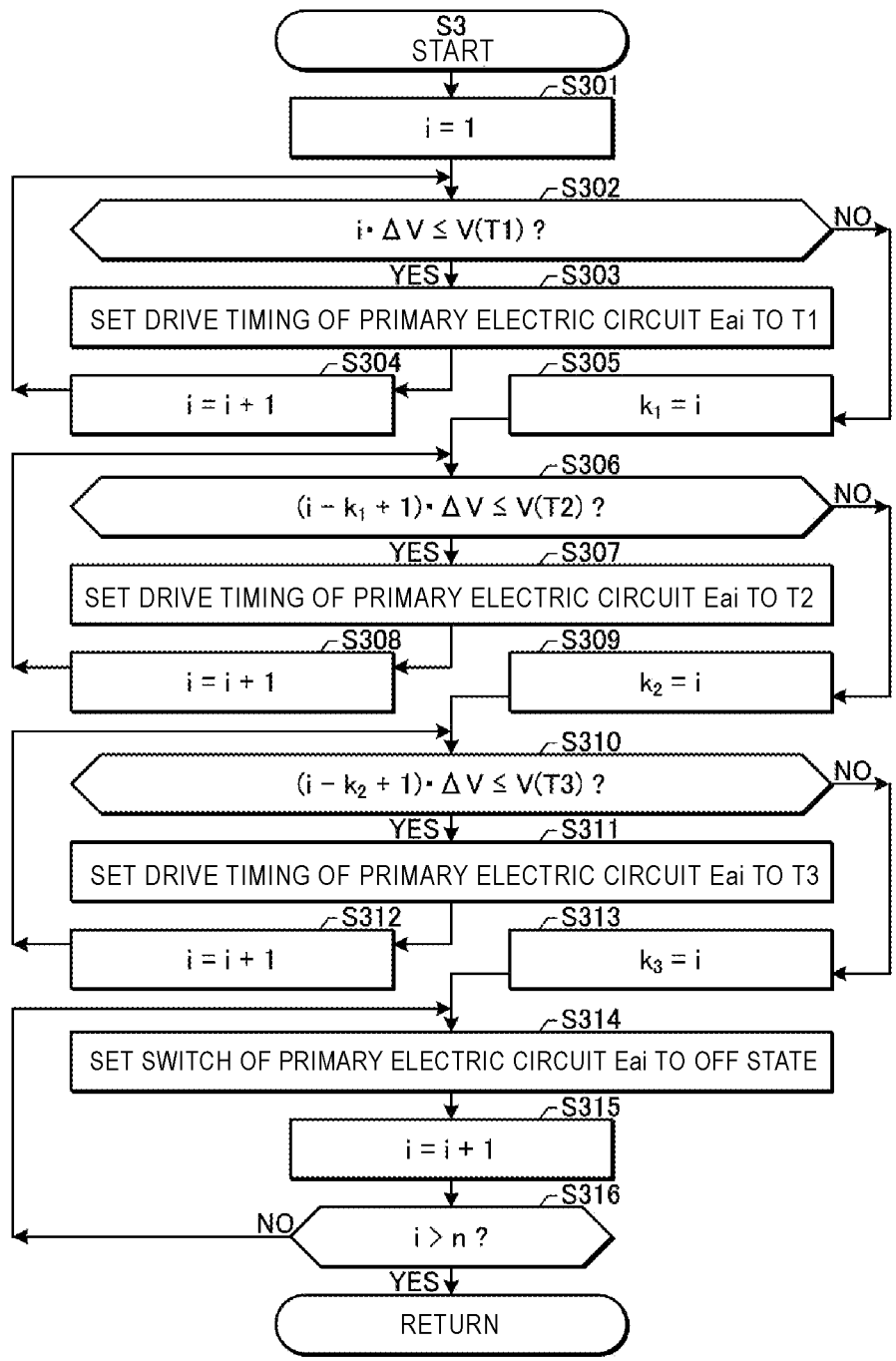
FIG. 4 is a flowchart for describing a subroutine of drive timing setting processing in S3 of FIG. 3.

FIG. 4 is a flowchart for describing a subroutine of the drive timing setting processing in S3 of FIG. 3.

In S301, the laser control unit 30 sets an identification number i to 1. In the present flowchart, when the identification number i is set, one primary electric circuit Eai among the n primary electric circuits Ea1 to Ean is identified. When the identification number i is set, one charger 12i corresponding to the primary electric circuit Eai is also identified. In the following processing, the laser control unit 30 sets the drive timing of the primary electric circuit Eai while counting up the identification number i.

1.5.2.1 Primary Electric Circuit Driven at Time T1

In S302, the laser control unit 30 determines whether the total value of the charge voltages of the i chargers 121 to 12i identified by the identification numbers 1 to i is equal to or smaller than the application voltage V(T1). The application voltage V(T1) is the value set in S1 of FIG. 3 as the application voltage to be applied between the pair of discharge electrodes 11a, 11b at the time T1. The total value of the charge voltages of the i chargers 121 to 12i is expressed by $i \cdot \Delta V$. Therefore, the determination in S302 is performed based on whether the following condition is satisfied.

$$i \cdot \Delta V \leq V(T1)$$

When the total value $i \cdot \Delta V$ of the charge voltages is larger than the application voltage V(T1) (S302: NO), the laser control unit 30 proceeds to S305. When the total value $i \cdot \Delta V$ of the charge voltages is equal to or smaller than the application voltage V(T1) (S302: YES), the laser control unit 30 proceeds to S303.

In S303, the laser control unit 30 sets the drive timing of the primary electric circuit Eai identified by the identification number i to the time T1.

In S304, the laser control unit 30 updates the value of the identification number i by adding 1 to the value of the identification number i. Thereafter, the laser control unit 30 returns to S302.

In S305, the laser control unit 30 sets a first threshold value $k_1$ to the current identification number i. The $k_1-1$ primary electric circuits Ea1 to Ea$k_1$-1 identified by the identification numbers 1 to $k_1-1$ less than the first threshold value $k_1$ are the primary electric circuits to be driven at the timing delayed by the time T1 from the oscillation trigger signal. The primary electric circuits Ea$k_1$ to Ean identified by the identification numbers $k_1$ to n equal to or more than the first threshold value $k_1$ are the primary electric circuits not to be driven at the timing delayed by the time T1 from the oscillation trigger signal. With this setting, when the $k_1-1$ primary electric circuits Ea1 to Ea$k_1$-1 are simultaneously driven, a voltage close to the application voltage V(T1) may be applied between the pair of discharge electrodes 11a, 11b.

1.5.2.2 Primary Electric Circuit Driven at Time T2

In S306, the laser control unit 30 determines whether the total value of the charge voltages of the $i-k_1+1$ chargers 12$k$1 to 12i identified by the identification numbers $k_1$ to i is equal to or smaller than the application voltage V(T2). The application voltage V(T2) is the value set in S1 of FIG. 3 as the application voltage to be applied between the pair of discharge electrodes 11a, 11b at the time T2. The total value of the charge voltages of the $i-k_1+1$ chargers 12$k_1$ to 12i is expressed by $(i-k_1+1) \cdot \Delta V$. Therefore, the determination in S306 is performed based on whether the following condition is satisfied.

$$(i-k_1+1) \cdot \Delta V \leq V(T2)$$

When the total value $(i-k_1+1) \cdot \Delta V$ of the charge voltages is larger than the application voltage V(T2) (S306: NO), the laser control unit 30 proceeds to S309. When the total value $(i-k_1+1) \cdot \Delta V$ of the charge voltages is equal to or smaller than the application voltage V(T2) (S306: YES), the laser control unit 30 proceeds to S307.

In S307, the laser control unit 30 sets the drive timing of the primary electric circuit Eai identified by the identification number i to the time T2.

In S308, the laser control unit 30 updates the value of the identification number i by adding 1 to the value of the identification number i. Thereafter, the laser control unit 30 returns to S306.

In S309, the laser control unit 30 sets a second threshold value $k_2$ to the current identification number i. The $k_2-k_1$ primary electric circuits Ea$k_1$ to Ea$k_2$-1 identified by the identification numbers $k_1$ to $k_2-1$ equal to or more than the first threshold value $k_1$ and less than the second threshold value $k_2$ are the primary electric circuits to be driven at the timing delayed by the time T2 from the oscillation trigger signal. The primary electric circuits Ea1 to Ea$k_1$-1 and Ea$k_2$ to Ean identified by the identification numbers 1 to $k_1-1$ and $k_2$ to n are the primary electric circuits not to be driven at the timing delayed by the time T2 from the oscillation trigger signal. With this setting, when the $k_2-k_1$ primary electric circuits Ea$k_1$ to Ea$k_2$-1 are simultaneously driven, a voltage close to the application voltage V(T2) may be applied between the pair of discharge electrodes 11a, 11b.

1.5.2.3 Primary Electric Circuit Driven at Time T3

In S310, the laser control unit 30 determines whether the total value of the charge voltages of the $i-k_2+1$ chargers 12$k_2$ to 12i identified by the identification numbers $k_2$ to i is equal to or smaller than the application voltage V(T3). The application voltage V(T3) is the value set in S1 of FIG. 3 as the application voltage to be applied between the pair of discharge electrodes 11a, 11b at the time T3. The total value of the charge voltages of the $i-k_2+1$ chargers 12$k_2$ to 12i is expressed by $(i-k_2+1) \cdot \Delta V$. Therefore, the determination in S310 is performed based on whether the following condition is satisfied.

$$(i-k_2+1) \cdot \Delta V \leq V(T3)$$

When the total value $(i-k_2+1) \cdot \Delta V$ of the charge voltages is larger than the application voltage V(T3) (S310: NO), the laser control unit 30 proceeds to S313. When the total value $(i-k_2+1) \cdot \Delta V$ of the charge voltages is equal to or smaller than the application voltage V(T3) (S310: YES), the laser control unit 30 proceeds to S311.

In S311, the laser control unit 30 sets the drive timing of the primary electric circuit Eai identified by the identification number i to the time T3.

In S312, the laser control unit 30 updates the value of the identification number i by adding 1 to the value of the identification number i. Thereafter, the laser control unit 30 returns to S310.

In S313, the laser control unit 30 sets a third threshold value $k_3$ to the current identification number i. The $k_3-k_2$ primary electric circuits $Eak_2$ to $Eak_3-1$ identified by the identification numbers $k_2$ to $k_3-1$ equal to or more than the second threshold value $k_2$ and less than the third threshold value $k_3$ are the primary electric circuits to be driven at the timing delayed by the time T3 from the oscillation trigger signal. The primary electric circuits Ea1 to $Eak_2-1$ and $Eak_3$ to Ean identified by the identification numbers 1 to $k_2-1$ and $k_3$ to n are the primary electric circuits not to be driven at the timing delayed by the time T3 from the oscillation trigger signal. With this setting, when the $k_3-k_2$ primary electric circuits $Eak_2$ to $Eak_3-1$ are simultaneously driven, a voltage close to the application voltage V(T3) may be applied between the pair of discharge electrodes 11a, 11b.

1.5.2.4 Primary Electric Circuit not to be Driven

In S314, the laser control unit 30 sets the switches SWi1 to SWim included in the primary electric circuit Eai having the identification number i to the off state. That is, the primary electric circuit Eai having the identification number i is set as the primary electric circuit not to be driven.

In S315, the laser control unit 30 updates the value of the identification number i by adding 1 to the value of the identification number i.

In S316, the laser control unit 30 determines whether the value of the current identification number i is more than the number n of the primary electric circuits Ea1 to Ean. When the value of the current identification number i is equal to or less than the number n of the primary electric circuits Ea1 to Ean (S316: NO), the laser control unit 30 returns to S314. When the value of the current identification number i is more than the number n of the primary electric circuits Ea1 to Ean (S316: YES), the laser control unit 30 ends the processing of the present flowchart and proceeds to S4 of FIG. 3.

The timing data is generated as described above.

1.5.3 Time Chart

Figure 5:
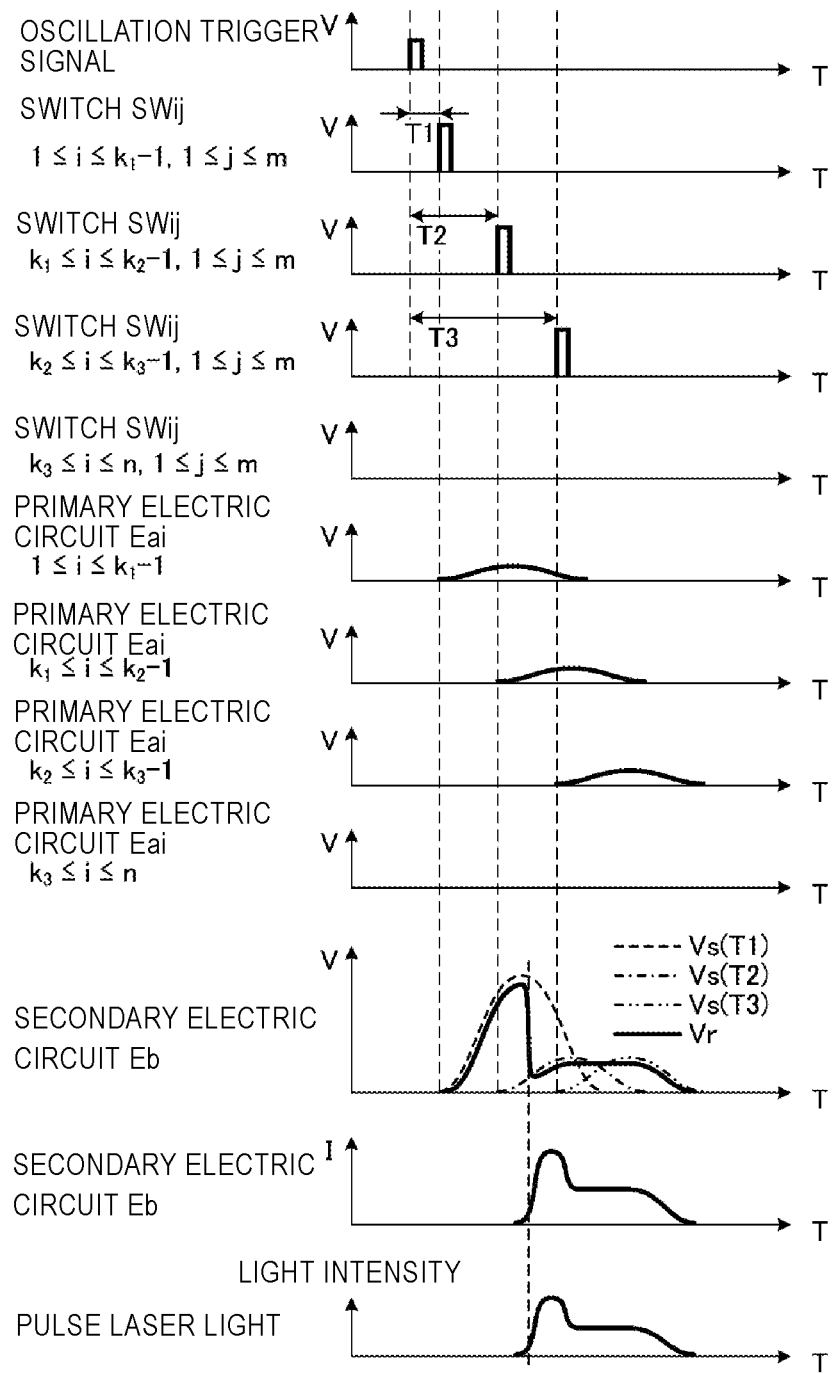
FIG. 5 is a time chart for describing waveform control by setting the drive timing.

FIG. 5 is a time chart for describing waveform control by setting the drive timing. The horizontal axis of FIG. 5 shows time T. The vertical axis of FIG. 5 shows intensity of signals such as a voltage V.

The laser control unit 30 outputs the oscillation trigger signal to the circuit drive unit 60. In addition to the oscillation trigger signal, the laser control unit 30 outputs the timing data to the circuit drive unit 60.

The circuit drive unit 60 transmits a circuit drive signal to the primary electric circuits Ea1 to $Eak_1-1$ identified by the identification numbers 1 to $k_1-1$ at the timing delayed by the time T1 from the oscillation trigger signal. Thus, the switches SWij included in the primary electric circuits Ea1 to $Eak_1-1$ are switched to the on state.

The circuit drive unit 60 transmits the circuit drive signal to the primary electric circuits $Eak_1$ to $Eak_2-1$ identified by the identification numbers $k_1$ to $k_2-1$ at the timing delayed by the time T2 from the oscillation trigger signal. Thus, the switches SWij included in the primary electric circuits $Eak_1$ to $Eak_2-1$ are switched to the on state.

The circuit drive unit 60 transmits the circuit drive signal to the primary electric circuits $Eak_2$ to $Eak_3-1$ identified by the identification numbers $k_2$ to $k_3-1$ at the timing delayed by the time T3 from the oscillation trigger signal. Thus, the switches SWij included in the primary electric circuits $Eak_2$ to $Eak_3-1$ are switched to the on state.

The circuit drive unit 60 maintains the switches SWij included in the primary electric circuits $Eak_3$ to Ean identified by the identification numbers $k_3$ to n in the off state.

In each primary electric circuit Eai of the primary electric circuits Ea1 to $Eak_3-1$, when the switches SWij are switched to the on state, a pulse voltage having a peak value being the charge voltage ΔV is applied to both ends of the primary coil Lai.

Each primary electric circuit Eai of the primary electric circuits $Eak_3$ to Ean is maintained in a non-driven state.

In the $k_1-1$ secondary coils Lb1 to $Lbk_1-1$ included in the secondary electric circuit Eb, a voltage Vs (T1) due to induced electromotive forces is generated at the timing delayed by the time T1 from the oscillation trigger signal. The voltage Vs (T1) corresponds to the voltage obtained by summing the voltages applied to the primary coils La1 to $Lak_1-1$ in the $k_1-1$ primary electric circuits Ea1 to $Eak_1-1$. The peak value of the voltage Vs (T1) is $(k_1-1)·ΔV$.

In the $k_2-k_1$ secondary coils $Lbk_1$ to $Lbk_2-1$ included in the secondary electric circuit Eb, a voltage Vs(T2) due to induced electromotive forces is generated at the timing delayed by the time T2 from the oscillation trigger signal. The voltage Vs(T2) corresponds to the voltage obtained by summing the voltages applied to the primary coils $Lak_1$ to $Lak_2-1$ in the $k_2-k_1$ primary electric circuits $Eak_1$ to $Eak_2-1$. The peak value of the voltage Vs (T2) is $(k_2-k_1)·ΔV$.

In the $k_3-k_2$ secondary coils $Lbk_2$ to $Lbk_3-1$ included in the secondary electric circuit Eb, a voltage Vs(T3) due to induced electromotive forces is generated at the timing delayed by the time T3 from the oscillation trigger signal. The voltage Vs(T3) corresponds to the voltage obtained by summing the voltages applied to the primary coils $Lak_2$ to $Lak_3-1$ in the $k_3-k_2$ primary electric circuits $Eak_2$ to $Eak_3-1$. The peak value of the voltage Vs (T3) is $(k_3-k_2)·ΔV$.

The number $k_1-1$ of the primary electric circuits Ea1 to $Eak_1-1$ driven at the timing of the time T1 is preferably more than the number $k_2-k_1$ of the primary electric circuits $Eak_1$ to $Eak_2-1$ driven at the timing of the time T2. The number $k_1-1$ of the primary electric circuits Ea1 to $Eak_1-1$ driven at the timing of the time T1 is preferably more than the number $k_3-k_2$ of the primary electric circuits $Eak_1$ to $Eak_3-1$ driven at the timing of the time T3. In this case, the absolute value of the peak value of the voltage Vs (T1) generated at the $k_1-1$ secondary coils Lb1 to $Lbk_1-1$ is more than the absolute value of the peak value of the voltage Vs(T2) generated at the $k_2-k_1$ secondary coils $Lbk_1$ to $Lbk_2-1$. The absolute value of the peak value of the voltage Vs(T1) generated at the $k_1-1$ secondary coils Lb1 to $Lbk_1-1$ is more than the absolute value of the peak value of the voltage Vs(T3) generated at the $k_3-k_2$ secondary coils $Lbk_2$ to $Lbk_3-1$.

The pulse waveform of a voltage Vr applied between the pair of discharge electrodes 11a, 11b has a waveform substantially similar to the waveform of the voltage Vs(T1) until immediately before dielectric breakdown occurs. When the dielectric breakdown occurs and the main discharge is started, the voltage Vr suddenly approaches 0. Thereafter, while the voltages Vs(T2), Vs(T3) are applied, the voltage Vr does not become 0 and is maintained at a voltage at which the main discharge can be continued.

Immediately after the dielectric breakdown, a current I flowing in the secondary electric circuit Eb reaches a peak. Thereafter, while the main discharge is continued, a current lower than the peak current flows in the secondary electric circuit Eb.

The laser gas is excited by the main discharge to emit light, and pulse laser light is emitted from the gas laser apparatus 1. The pulse waveform of the pulse laser light is substantially similar to the pulse waveform of the current flowing in the secondary electric circuit Eb.

By setting the drive timing as described above, the waveform control of the pulse laser light is performed.

1.6 Arrangement on Substrate

Figure 6A:
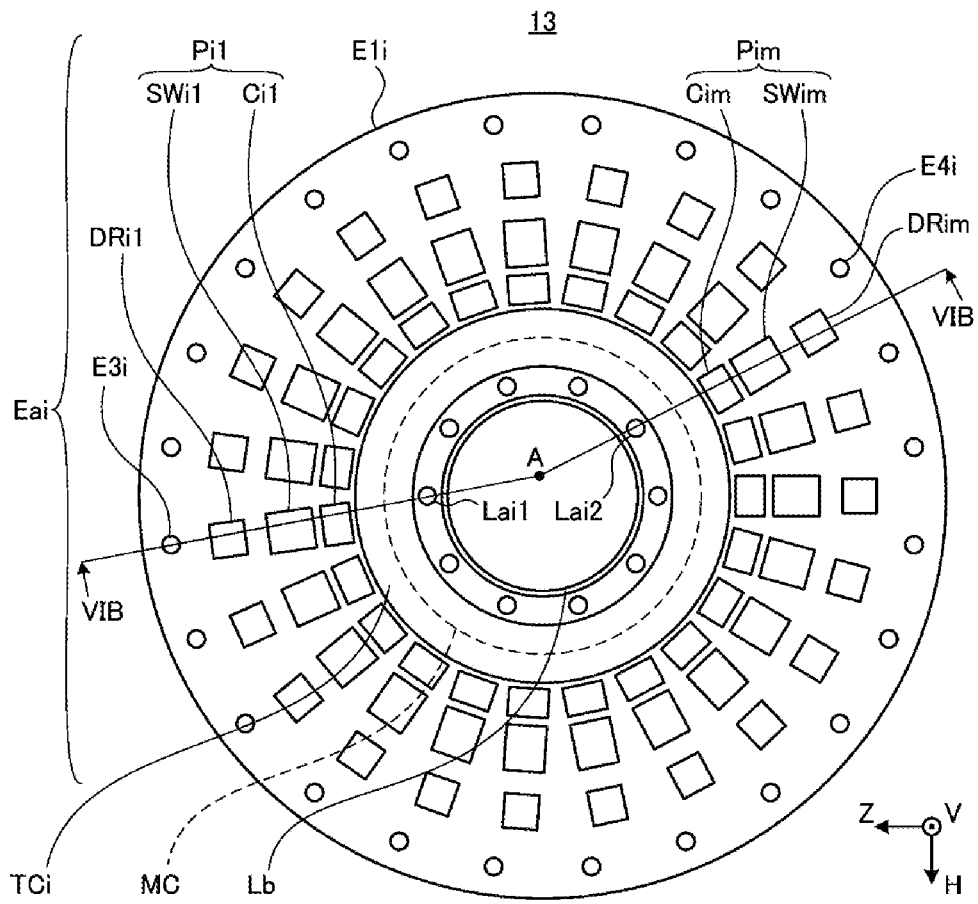
FIG. 6A is a plan view showing an example in which the pulse power module 13 is mounted on a circular substrate.
Figure 6B:
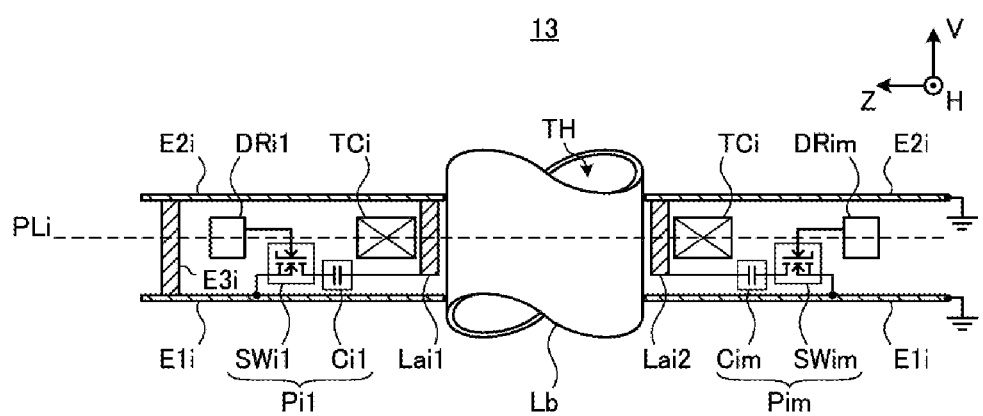
FIG. 6B schematically shows a cross-section along line VIB-A-VIB in FIG. 6A.

FIG. 6A is a plan view showing an example in which the pulse power module 13 is mounted on a circular substrate. FIG. 6B schematically shows a cross-section along line VIB-A-VIB in FIG. 6A. Here, in FIG. 6B, the secondary coil Lb is shown in a side view rather than in a cross-section. FIGS. 6A and 6B show one primary electric circuit Eai among the n primary electric circuits Ea1 to Ean, one transformer core TCi, and a part of the secondary coil Lb.

The transformer core TCi has a ring shape. As shown in FIG. 6A, a magnetic circuit MC is formed along the ring configuring the transformer core TCi. As shown in FIG. 6B, the transformer core TCi is located on a first plane PLi. The first plane PLi is parallel to the HZ plane. The magnetic circuit MC is formed along the first plane PLi.

The secondary coil Lb is formed of a conductive member having a cylindrical shape. As shown in FIG. 6B, the secondary coil Lb has a through hole TH. The through hole TH passes through the secondary coil Lb in a direction perpendicular to the first plane PLi. Illustration of n diodes Db1 to Dbn is omitted.

The primary electric circuit Eai includes substrates E1$i$ and E2$i$ and components mounted on the substrate E1$i$. In FIG. 6A, the substrate E2$i$ is omitted. The substrates E1$i$ and E2$i$ are both parallel to the first plane PLi. The transformer core TCi is also mounted on the substrate E1$i$. The substrates E1$i$ and E2$i$ each include a conductive member. The substrates E1$i$ and E2$i$ are both connected to the reference potential.

The components mounted on the substrate E1$i$ include a plurality of primary coils Lai1 and Lai1, m pulse generation units Pi1 to Pim, m switch drive units DRi1 to DRim, and a plurality of conductive members E3$i$ and E4$i$. The components mounted on the substrate E1$i$ are arranged between the substrates E1$i$ and E2$i$ together with the transformer core TCi. Each of the substrates E1$i$ and E2$i$ and the transformer core TCi has a through hole, and the secondary coil Lb penetrates the through holes in a direction perpendicular to the first plane PLi. As shown in FIG. 6A, the m pulse generation units Pi1 to Pim and the m switch drive units DRi1 to DRim are arranged radially around the transformer core TCi.

The plurality of primary coils Lai1 and Lai2 each include a conductive member. The plurality of primary coils Lai1 and Lai2 are arranged in a space outside the secondary coil Lb and inside the transformer core TCi. That is, the plurality of primary coils Lai1 and Lai2 are arranged in a space between the secondary coil Lb and the transformer core TCi. As shown in FIG. 6B, one end of each of the primary coils Lai1 and Lai2 is electrically connected to the substrate E2$i$, and is connected to the reference potential through the substrate E2$i$.

The m pulse generation units Pi1 to Pim include m capacitors Ci1 to Cim and m switches SWi1 to SWim. As shown in FIG. 6B, in each pulse generation unit Pij of the m pulse generation units Pi1 to Pim, the capacitor Cij and the switch SWij are connected in series.

The m switches SWi1 to SWim are configured by m MOSFETs. Source terminals of the m MOSFETs configuring the m switches SWi1 to SWim are electrically connected to the substrate E1$i$, and are connected to the reference potential through the substrate E1$i$. Gate terminals of the m MOSFETs configuring the m switches SWi1 to SWim are connected to the m switch drive units DRi1 to DRim through signal lines, respectively. Drain terminals of the m MOSFETs configuring the switches SWi1 to SWim are electrically connected to terminals on one side of the m capacitors Ci1 to Cim, respectively.

The terminals on the other side of the m capacitors Ci1 to Cim are electrically connected to ends of the plurality of primary coils Lai1 and Lai2, respectively, opposite to the ends connected to the substrate E1$i$ through the conductive members. The output terminal of the charger 12 (see FIG. 1 and FIG. 7) is electrically connected to the conductive members connecting the m capacitors Ci1 to Cim and the plurality of primary coils Lai1 and Lai2. The conductive members connecting the m capacitors Ci1 to Cim and the plurality of primary coils Lai1 and Lai2 are arranged between the transformer core TCi and the substrate E1$i$. An electrically insulating member (not shown) is arranged between the substrate E1$i$ and the conductive members connecting the m capacitors Ci1 to Cim and the plurality of primary coils Lai1 and Lai2.

The plurality of conductive members E3$i$ and E4$i$ are electrically connected between the substrates E1$i$ and E2$i$.

In other respects, the configuration of FIGS. 6A and 6B is similar to that described with reference to FIG. 2.

1.7 Structure in which n Primary Electric Circuits are Laminated

Figure 7:
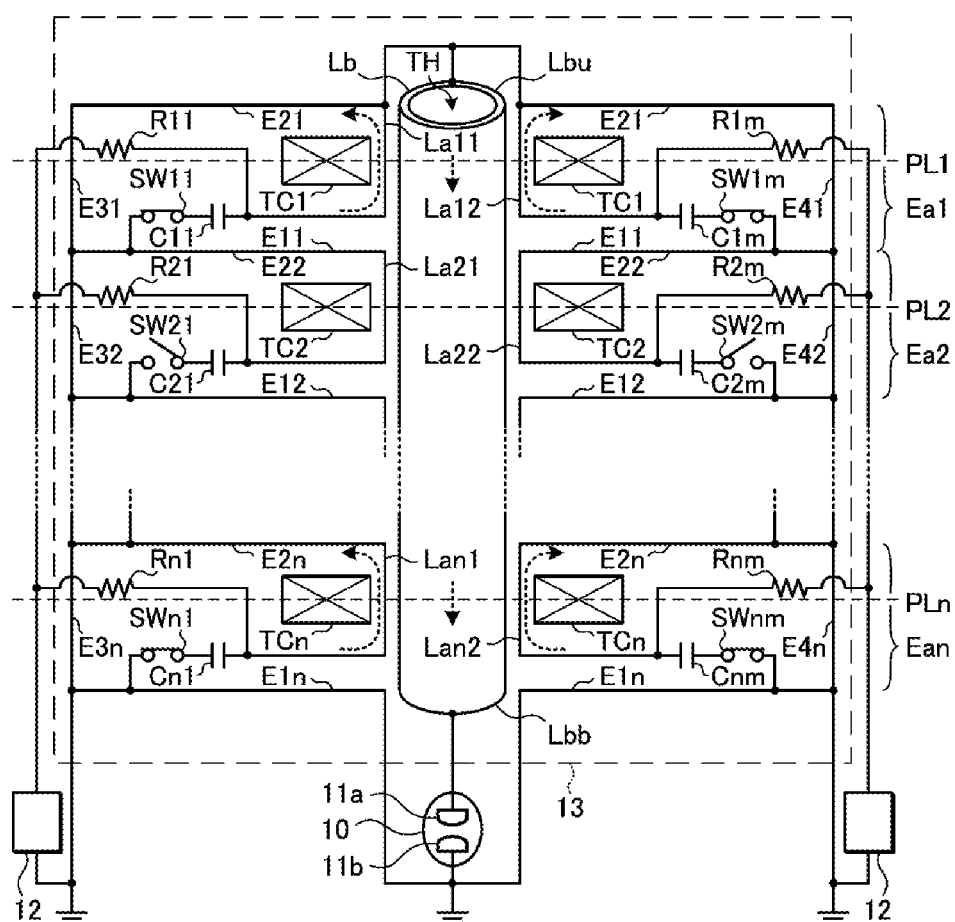
FIG. 7 schematically shows the structure of the pulse power module 13 configured by n primary electric circuits Ea1 to Ean and n transformer cores TC1 to TCn.

FIG. 7 schematically shows the structure of the pulse power module 13 configured by n primary electric circuits Ea1 to Ean and n transformer cores TC1 to TCn. The n transformer cores TC1 to TCn are arranged side by side in the V direction. The n transformer cores TC1 to TCn are arranged such that each of the first planes PL1 to PLn is parallel to the HZ plane.

The secondary coil Lb is arranged so as to penetrate the through holes of the n transformer cores TC1 to TCn. An upper end Lbu of the secondary coil Lb is connected to the reference potential, and a lower end Lbb of the secondary coil Lb is connected to the discharge electrode 11a. In the present disclosure, the "coil" is not limited to a conductive wire having a plurality of turns. Even a conductive member only penetrating the through hole of the transformer core TCi corresponds to the coil of the present disclosure as long as magnetic energy can be transmitted between the conductive member and the transformer core TCi. The secondary coil Lb corresponds to that in which the n secondary coils Lb1 to Lbn described with reference to FIG. 2 are connected in series.

The n primary electric circuits Ea1 to Ean are arranged side by side in the V direction. The plurality of primary coils Lai1 and Lai1 included in each of the primary electric circuit Eai of the n primary electric circuits Ea1 to Ean are arranged in a space inside the transformer core TCi and outside the secondary coil Lb.

The substrate E11 included in the primary electric circuit Ea1 may include a conductive member common with the substrate E22 included in the primary electric circuit Eat adjacent to the primary electric circuit Ea1. That is, the substrate E1$i$ included in the primary electric circuit Eai may include a conductive member common with the substrate E2$i$+1 included in the primary electric circuit Eai+1. Here, $i$ is a natural number in the range of 1 to n−1. Alternatively, the substrate E1$i$ itself may be commonly used as the substrate E2$i$+1, and the substrate E2$i$+1 may be omitted.

In one primary electric circuit Eai among the n primary electric circuits Ea1 to Ean, the output terminal of the charger 12 is electrically connected to the conductive member connecting the m capacitors Ci1 to Cim and each of the plurality of primary coils Lai1 and Lai1. Each of resistance elements Ri1 to Rim may be connected between the charger 12 and the primary electric circuit Eai. The charger 12 may be a common charger connected to the n primary electric circuits Ea1 to Ean.

In other respects, the configuration of FIG. 7 is similar to that described with reference to FIGS. 6A and 6B.

In FIG. 7, the charger 12 charges the capacitors Cij included in the n primary electric circuits Ea1 to Ean with the charge voltage $\Delta V$.

For example, when the m switches SW11 to SWim included in the primary electric circuit Ea1 is switched from the off state to the on state, a pulse current flows from them capacitors C11 to C1m. The pulse current flowing from the capacitors C11 to C1m flows into the primary coils La11 and La12. In the primary coils La11 and La12, the pulse current flows upward from the lower side of FIG. 7. The pulse current flowing in the primary coils La11 and La12 generates a magnetic flux at the transformer core TC1, and the generation of the magnetic flux generates an induced electromotive force at the secondary coil Lb.

Due to the generation of the induced electromotive force at the secondary coil Lb, a pulse voltage is applied between the pair of discharge electrodes 11a, 11b. The induced electromotive force generated at the secondary coil Lb by driving one primary electric circuit Ea1 is substantially equal to the charge voltage $\Delta V$ of the charger 12. When the number of the primary electric circuits that are driven simultaneously among the n primary electric circuits Ea1 to Ean is i, the voltage applied between the pair of discharge electrodes 11a, 11b is $i \cdot \Delta V$.

When the voltage is applied between the pair of discharge electrodes 11a, 11b and dielectric breakdown occurs, discharge occurs between the pair of discharge electrodes 11a, 11b and the pulse current flows in the secondary coil Lb. In the secondary coil Lb, the pulse current flows downward from the upper side of FIG. 7. When the discharge occurs, the laser gas is excited and pulse laser light is generated.

1.8 Problem

Figure 8A:
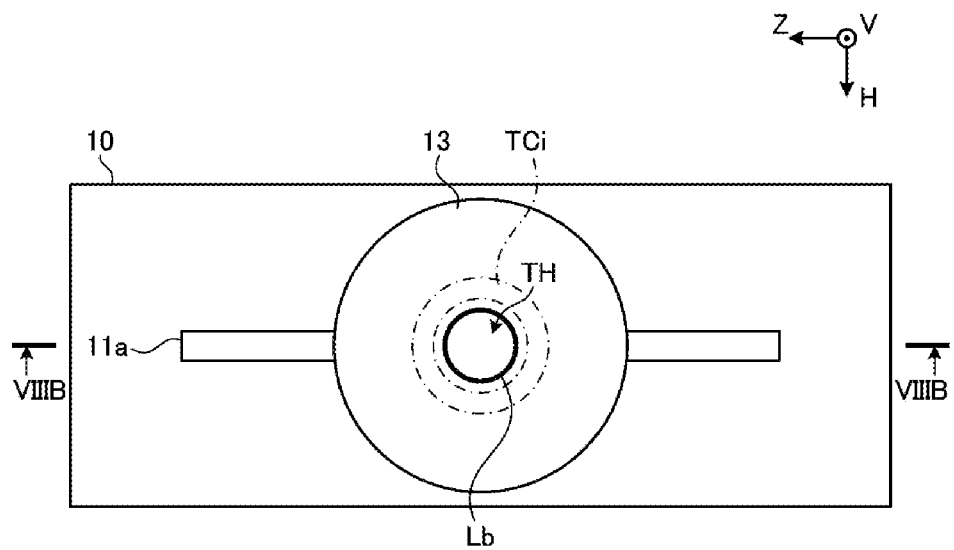
FIG. 8A is a plan view showing a state in which the pulse power module 13 is arranged on a laser chamber 10.
Figure 8B:
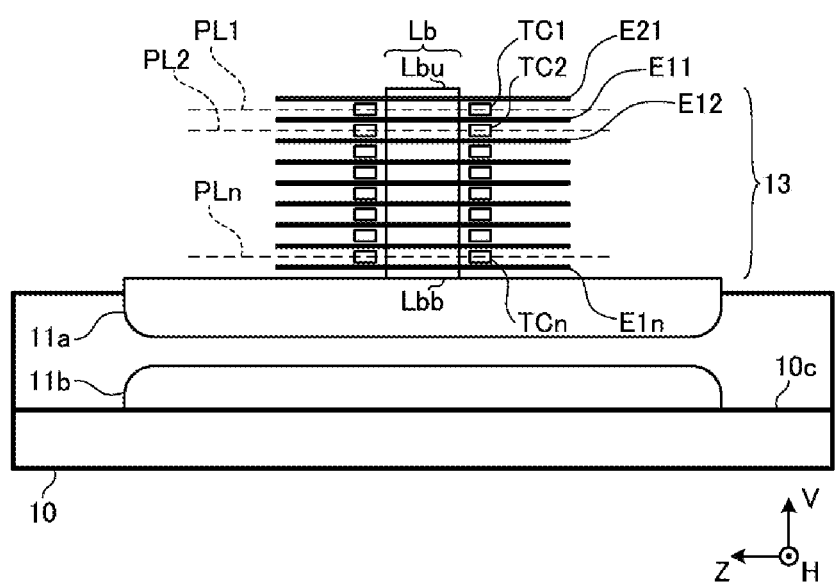
FIG. 8B is a sectional view along line VIIIB-VIIIB in FIG. 8A.

FIG. 8A is a plan view showing a state in which the pulse power module 13 is arranged on the laser chamber 10. FIG. 8B is a sectional view along line VIIIB-VIIIB in FIG. 8A. In FIG. 8B, only the substrates E21 and E11 to E1n are shown for the n primary electric circuits Ea1 to Ean, and other circuit elements are omitted.

As shown in FIG. 8B, the n transformer cores TC1 to TCn are arranged side by side in the V direction. The n transformer cores TC1 to TCn are arranged such that each of the first planes PL1 to PLn are parallel to the HZ plane.

The secondary coil Lb is arranged so as to penetrate all through holes of the n transformer cores TC1 to TCn. The upper end Lbu of the secondary coil Lb is connected to the reference potential, and the lower end Lbb of the secondary coil Lb is connected to the discharge electrode 11a. The discharge electrode 11b is connected to the reference potential.

The substrate E21 and the n substrates E11 to E1n are arranged so as to sandwich the n transformer cores TC1 to TCn.

In the configuration shown in FIGS. 8A and 8B, a pulse high voltage generated by the pulse power module 13 is applied to the vicinity of the center of the discharge electrode 11a in the longitudinal direction. The inductance from the pulse power module 13 to each portion of the discharge electrode 11a depends on the distance from the vicinity of the center of the discharge electrode 11a in the longitudinal direction. Since the discharge electrode 11a has an elongated shape, there is a case where the inductance from the pulse power module 13 to an end of the discharge electrode 11a in the longitudinal direction is increased. Therefore, the current density in the discharge space between the pair of discharge electrodes 11a, 11b at the time of discharge in the discharge space may vary depending on the distance from the vicinity of the center of the discharge electrode 11a in the longitudinal direction.

Further, when the inductance becomes large, it becomes impossible to supply a current at high speed to the discharge space from the pulse power module 13. Therefore, time difference may occur in the rise of the pulse current in the discharge space, and the current density may become non-uniform.

In the embodiments described below, the shape of the n transformer cores TC1 to TCn is elongated in the longitudinal direction of the pair of discharge electrodes 11a, 11b. Accordingly, deviation of the inductance from the pulse power module 13 to each portion of the discharge electrode 11a is reduced, and deviation of the current density can be reduced.

2. Pulse Power Module Having Transformer Core Elongated in Z Direction

Figure 9A:
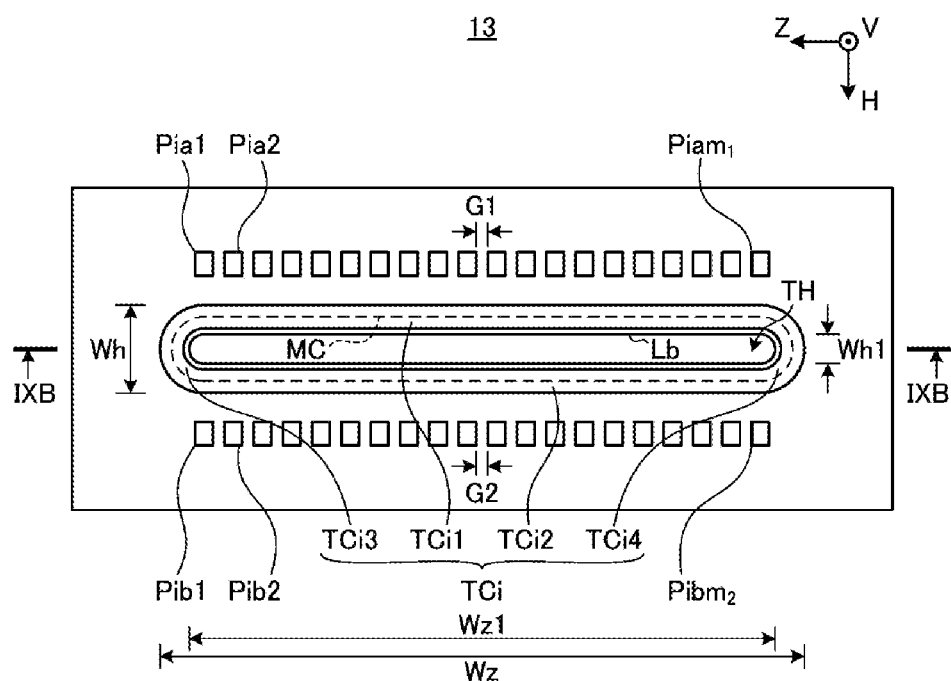
FIG. 9A is a plan view showing a state in which the pulse power module 13 of a first embodiment of the present disclosure is arranged on the laser chamber 10.
Figure 9B:
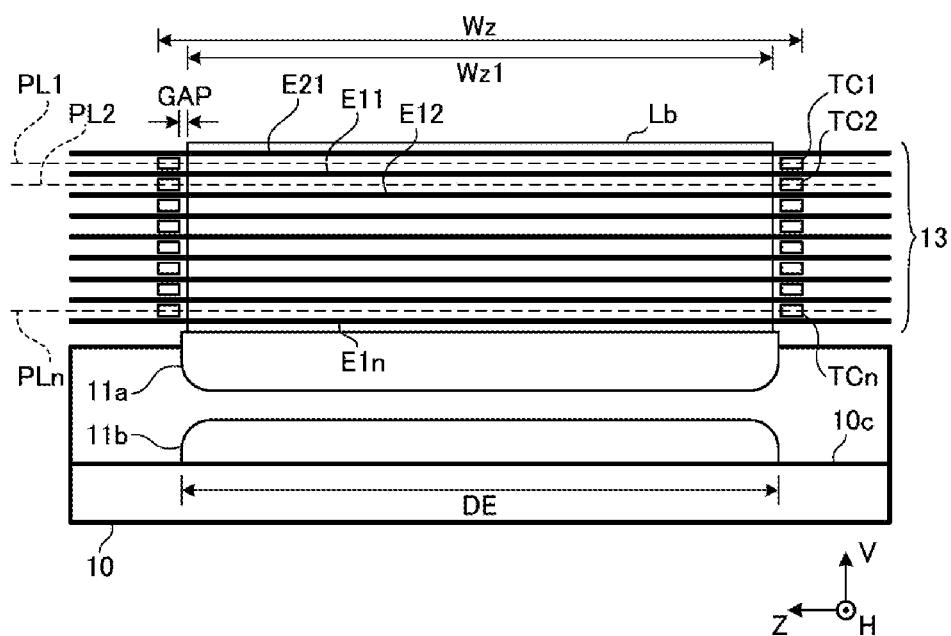
FIG. 9B is a sectional view along line IXB-IXB in FIG. 9A.

FIG. 9A is a plan view showing a state in which the pulse power module 13 of a first embodiment of the present disclosure is arranged on the laser chamber 10. FIG. 9B is a sectional view along line IXB-IXB in FIG. 9A. The pulse power module 13 corresponds to the high voltage pulse generation device of the present disclosure.

The laser chamber 10 has substantially the same shape as the substrates E11 to E1n included in the pulse power module 13 in the plan view shown in FIG. 9A. Therefore, only the pulse power module 13 is shown in FIG. 9A. Since the n transformer cores TC1 to TCn have the same configuration with each other and the n primary electric circuits Ea1 to Ean have the same configuration with each other, the components X1 to Xn are substituted by the reference sign Xi in FIG. 9A. In FIG. 9A, the substrate E21 is omitted.

2.1 Configuration of Transformer Core

In the first embodiment, the shape of each transformer core TCi of the n transformer cores TC1 to TCn is a shape in which a width Wz in the Z direction is larger than a width Wh in the H direction. The Z direction is a first direction parallel to the first planes PL1 to PLn. The H direction is a second direction parallel to the first planes PL1 to PLn and perpendicular to the first direction. The transformer core TCi is arranged such that the Z direction, which is the longitudinal direction thereof, is parallel to the longitudinal direction of the pair of discharge electrodes 11a, 11b.

The shape of the transformer core TCi will be described in more detail. The transformer core TCi includes first and second linear portions TCi1 and TCi2 and first and second curved portions TCi3 and TCi4. The first and second linear portions TCi1 and TCi2 are arranged along the Z direction. The first curved portion TCi3 connects ends of the first and second linear portions TCi1 and TCi2 on the +Z direction side. The second curved portion TCi4 connects ends of the first and second linear portions TCi1 and TCi2 on the −Z direction side. In other words, the transformer core TCi has a racetrack shape.

The shape of the transformer core TCi is not limited to the above shape and may be rectangular or elliptic.

The width Wz of the transformer core TCi in the Z direction is preferably larger than the length DE (see FIG.

9B) in the longitudinal direction of the pair of discharge electrodes 11a, 11b. The width Wh of the transformer core TCi in the H direction is preferably larger than the length in the H direction of the pair of discharge electrodes 11a, 11b.

2.2 Configuration of Secondary Coil

The secondary coil Lb has a cylindrical shape having the through hole TH in a direction perpendicular to the first plane PLi, and having a width Wz1 in the Z direction larger than a width Wh1 in the H direction. The ratio of the Z direction width Wz1 of the secondary coil Lb to the length DE in the longitudinal direction of the pair of discharge electrodes 11a, 11b is preferably equal to or more than 0.5 and equal to or less than 2. The ratio is more preferably equal to or more than 0.8 and equal to or less than 1.2. It is further preferable that the ratio is about 1.

A gap GAP (see FIG. 9B) between the transformer core TCi and the secondary coil Lb is preferably equal to or smaller than 5 mm. The gap GAP is more preferably equal to or larger than 1 mm and equal to or smaller than 3 mm.

2.3 Configuration of m Pulse Generation Units

As shown in FIG. 9A, the m pulse generation units include $m_1$ pulse generation units Pia1 to Pia$m_1$ and $m_2$ pulse generation units Pib1 to Pib$m_2$. These pulse generation units are arranged outside the magnetic circuit MC formed in the transformer core TCi. The $m_1$ pulse generation units Pia1 to Piam1 are arranged side by side in the Z direction on the −H direction side of the transformer core TCi. The $m_2$ pulse generation units Pib1 to Pib$m_2$ are arranged side by side in the Z direction on the +H direction side of the transformer core TCi. The $m_1$ pulse generation units Pia1 to Pia$m_1$ and the $m_2$ pulse generation units Pib1 to Pib$m_2$ are arranged on opposite sides of the transformer core TCi. In FIG. 9A, the m switch drive units DRi1 to DRim are omitted.

Each of $m_1$ and $m_2$ is a natural number equal to or more than 2 and equal to or less than m. Here, $m_1$ and $m_2$ may be different numbers, but are preferably the same number. The $m_1$ pulse generation units Pia1 to Pia$m_1$ have a first gap G1 therebetween, and the $m_2$ pulse generation units Pib1 to Pib$m_2$ have a second gap G2 therebetween. Preferably, the first gap G1 and the second gap G2 are substantially the same.

2.4 Effect

With the configuration of the transformer core TCi and the secondary coil Lb described above, the deviation of the inductance from the secondary coil Lb to each portion of the discharge electrode 11a can be reduced. Accordingly, the deviation of the pulse current in the longitudinal direction of the discharge electrode 11a can be reduced.

By reducing the gap GAP between the transformer core TCi and the secondary coil Lb, magnetic energy can be efficiently transmitted between the transformer core TCi and the secondary coil Lb. Since the primary coils La11 and Lai2 (see FIGS. 6A and 6B) are arranged inside the transformer core TCi and outside the secondary coil Lb, magnetic energy can also be efficiently transmitted between the transformer core TCi and the primary coils La11 and Lai2.

Since the $m_1$ pulse generation units Pia1 to Pia$m_1$ and the $m_2$ pulse generation units Pib1 to Pib$m_2$ are arranged side by side in the longitudinal direction of the discharge electrode 11a, the deviation of the pulse current in the longitudinal direction of the discharge electrode 11a can be further reduced. By setting the first gap G1 between the $m_1$ pulse generation units Pia1 to Pia$m_1$ and the second gap G2 between the $m_2$ pulse generation units Pib1 to Pib$m_2$ substantially the same, the deviation of the pulse current in the longitudinal direction of the discharge electrode 11a can be further reduced.

In other respects, the first embodiment is similar to the comparative example described above.

Figure 10:
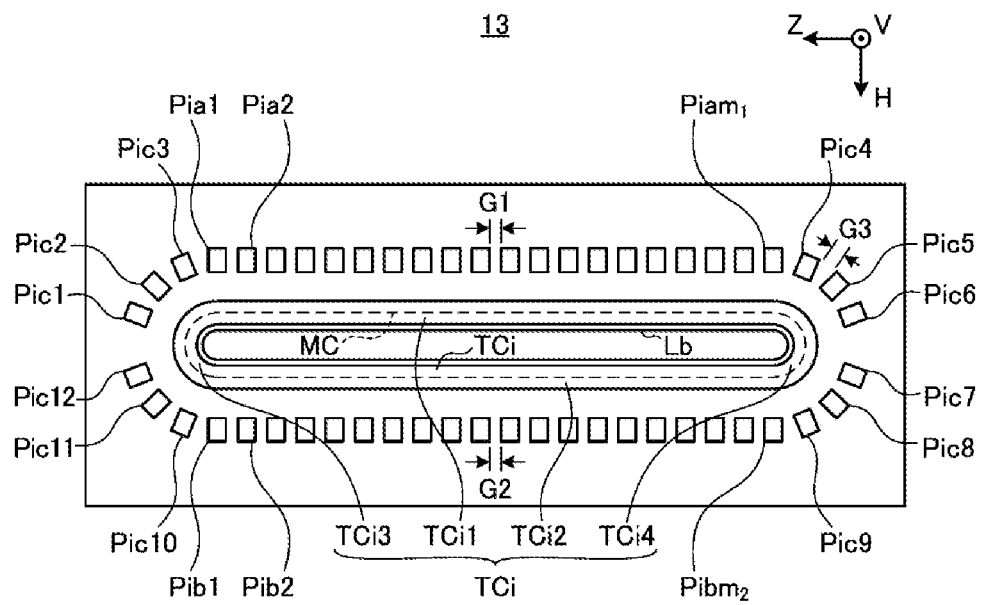
FIG. 10 is a plan view showing a state in which the pulse power module 13 of a second embodiment of the present disclosure is arranged on the laser chamber 10.

3. Pulse Power Module with Increased Number of Pulse Generation Units 3.1 Configuration FIG. 10 is a plan view showing a state in which the pulse power module 13 of a second embodiment of the present disclosure is arranged on the laser chamber 10.

In the second embodiment, the m pulse generation units further include $m_3$ (12 in FIG. 10) pulse generation units Pic1 to Pic12 in addition to the $m_1$ pulse generation units Pia1 to Pia$m_1$ and the $m_2$ pulse generation units Pib1 to Pib$m_2$. The $m_3$ pulse generation units Pic1 to Pic12 are arranged side by side around the first and second curved portions TCi3 and TCi4. The direction in which the $m_3$ pulse generation units Pic1 to Pic12 are arranged is a direction different from the Z direction. The $m_1$ pulse generation units Pia1 to Pia$m_1$ have the first gap G1 therebetween, and the $m_2$ pulse generation units Pib1 to Pib$m_2$ have the second gap G2 therebetween. Each of the first gap G1 and the second gap G2 may be smaller than a third gap G3 between the $m_3$ pulse generation units Pic1 to Pic12. Here, $m_3$ is a natural number equal to or more than 2 and equal to or less than m. Further, $m_3$ may be the same number as $m_1$ or $m_2$, or may be a different number.

3.2 Effect

According to the second embodiment, since the $m_3$ pulse generation units Pic1 to Pic12 are arranged, the current density in the discharge space in the vicinity of both ends of the pair of discharge electrodes 11a, 11b can be caused to be higher than that in the first embodiment.

By adjusting the number $m_3$ of the pulse generation units and the third gap G3, the current density in the discharge space in the vicinity of both ends of the pair of discharge electrodes 11a, 11b can be adjusted. By setting $m_3$ small and the third gap G3 larger than the first gap G1 and the second gap G2, it is possible to suppress the current density in the discharge space in the vicinity of both ends of the pair of discharge electrodes 11a, 11b from becoming too high.

In other respects, the second embodiment is similar to the first embodiment.

4. Pulse Power Module Including Trigger Input Unit 4.1 Arrangement of Elements

Figure 11:
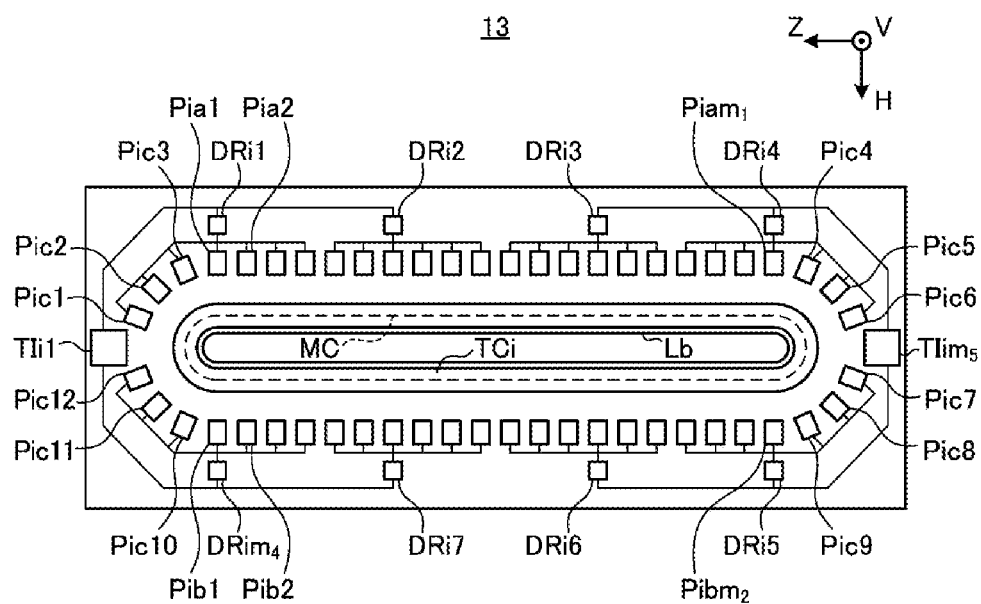
FIG. 11 is a plan view showing a state in which the pulse power module 13 of a third embodiment of the present disclosure is arranged on the laser chamber 10.

FIG. 11 is a plan view showing a state in which the pulse power module 13 of a third embodiment of the present disclosure is arranged on the laser chamber 10.

In the third embodiment, the primary electric circuit Eai includes $m_4$ switch drive units DRi1 to DRi$m_4$ instead of the m switch drive units DRi1 to DRim. The pulse generation units Pia1 to Pia$m_1$, Pib1 to Pib$m_2$, and Pic1 to Pic12 included in the primary electric circuit Eai are divided into $m_4$ groups. Each of the $m_4$ groups includes a plurality of pulse generation units. The $m_4$ switch drive units DRi1 to DRi$m_4$ are configured to transmit a switch drive signal to the $m_4$ groups, respectively. The switch drive signal is input to the gate terminal of the MOSFET configuring the switch included in each of the pulse generation units Pia1 to Pia$m_1$, Pib1 to Pib$m_2$, and Pic1 to Pic12. Here, $m_4$ is a natural number equal to or more than 2 and equal to or less than m and is, for example, 8.

The primary electric circuit Eai further includes $m_5$ trigger input units TIi1 to TIi$m_5$. The $m_4$ switch drive units DRi1 to $DRim_4$ are divided into $m_5$ groups. Each of the $m_5$ groups includes a plurality of switch drive units. The $m_5$ trigger input units $TIi1$ to $TIim_5$ are configured to provide a trigger signal to the $m_5$ groups, respectively. Here, $m_5$ is a natural number equal to or more than 2 and equal to or less than $m_4$ and is, for example, 2.

The signal lines connected respectively from the switch drive units $DRi1$, $DRi4$, $DRi5$, $DRim_4$ to the trigger input unit $TIi1$ or $TIim_5$ are shorter than the signal lines connected respectively from the switch drive units $DRi2$, $DRi3$, $DRi6$, $DRi7$ to the trigger input unit $TIi1$ or $TIim_5$. It is preferable that the $m_4$ switch drive units $DRi1$ to $DRim_4$ are operated substantially simultaneously by causing delays according to the lengths of the signal lines. For example, the gate resistances of the switching elements such as MOSFETs included in the switch drive units $DRi1$, $DRi4$, $DRi5$, $DRim_4$ may be set higher than those of the other switch drive units $DRi2$, $DRi3$, $DRi6$, $DRi7$. Alternatively, a delay circuit may be arranged in the middle of each of the signal lines connected respectively from the switch drive units $DRi1$, $DRi4$, $DRi5$, $DRim_4$ to the trigger input unit $TIi1$ or $TIim_5$.

4.2 Circuit Configuration

Figure 12:
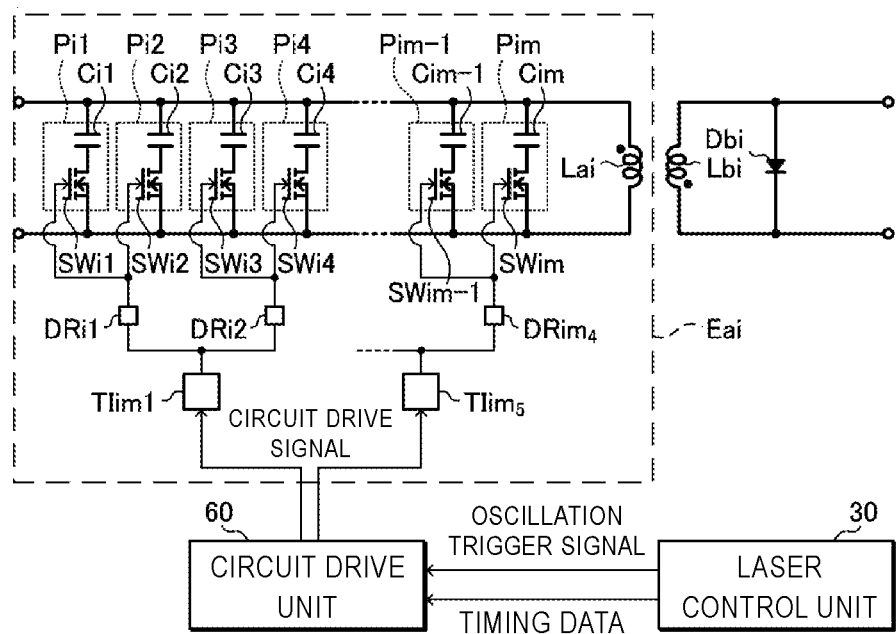
FIG. 12 shows a circuit diagram of the primary electric circuit Eai of the third embodiment.

FIG. 12 shows a circuit diagram of the primary electric circuit Eai of the third embodiment.

In the third embodiment, the circuit drive unit 60 is configured to output an optical signal as the circuit drive signal. The circuit drive unit 60 is connected to the $m_5$ trigger input units $TIi1$ to $TIim_5$ through optical fibers. The optical signal output from the circuit drive unit 60 is input to the $m_5$ trigger input units $TIi1$ to $TIim_5$.

Each of the $m_5$ trigger input units $TIi1$ to $TIim_5$ is a converter that converts the optical signal into an electric signal. Signal lines of the electric signal output from the $m_5$ trigger input units $TIi1$ to $TIim_5$ are each connected to any of the $m_4$ switch drive units $DRi1$ to $DRim_4$. The $m_5$ trigger input units $TIi1$ to $TIim_5$ provide the electric signal to the $m_4$ switch drive units $DRi1$ to $DRim_4$ as a trigger signal.

Each of the $m_4$ switch drive units $DRi1$ to $DRim_4$ receives an electric signal from any of the $m_5$ trigger input units $TIi1$ to $TIim_5$, and the switch drive signal is transmitted to the m pulse generation units $Pi1$ to $Pim$. The m pulse generation units $Pi1$ to $Pim$ correspond to the pulse generation units $Pia1$ to $Piam_1$, $Pib1$ to $Pibm_2$, and $Pic1$ to $Pic12$ in FIG. 11.

4.3 Effect

According to the third embodiment, since the optical signal is input from the circuit drive unit 60 to the $m_5$ trigger input units $TIi1$ to $TIim_5$, it is possible to reduce a shift in operation timing between the $m_5$ trigger input units $TIi1$ to $TIim_5$.

Further, the lengths of the signal lines from the $m_5$ trigger input units $TIi1$ to $TIim_5$ to the $m_4$ switch drive units $DRi1$ to $DRim_4$ can be set smaller than the length DE of the pair of discharge electrodes 11a, 11b in the longitudinal direction. In the example shown in FIG. 11, the lengths of the signal lines from the trigger input units $TIi1$ to $TIim_5$ to the switch drive units $DRi1$ to $DRim_4$ may be set smaller than half the length DE of the pair of discharge electrodes 11a, 11b in the longitudinal direction. Therefore, the variation of the lengths of the signal lines from the trigger input units $TIi1$ to $TIim_5$ to the switch drive units $DRi1$ to $DRim_4$ is reduced, and the shift in operation timing of the switch drive units $DRi1$ to $DRim_4$ can be reduced.

Further, by causing delays in accordance with the lengths of the signal lines, the shift in the operation timing of the switch drive units $DRi1$ to $DRim_4$ can be reduced.

Accordingly, the switch drive signal can be transmitted from the $m_4$ switch drive units $DRi1$ to $DRim_4$ to the pulse generation units $Pia1$ to $Piam_1$, $Pib1$ to $Pibm_2$, and $Pic1$ to $Pic12$ substantially simultaneously. Therefore, it is possible to reduce variations in the pulse generating timing among the pulse generation units $Pia1$ to $Piam_1$, $Pib1$ to $Pibm_2$, and $Pic1$ to $Pic12$.

In other respects, the third embodiment is similar to the second embodiment.

5. Pulse Power Module Including Many Trigger Input Units

Figure 13:
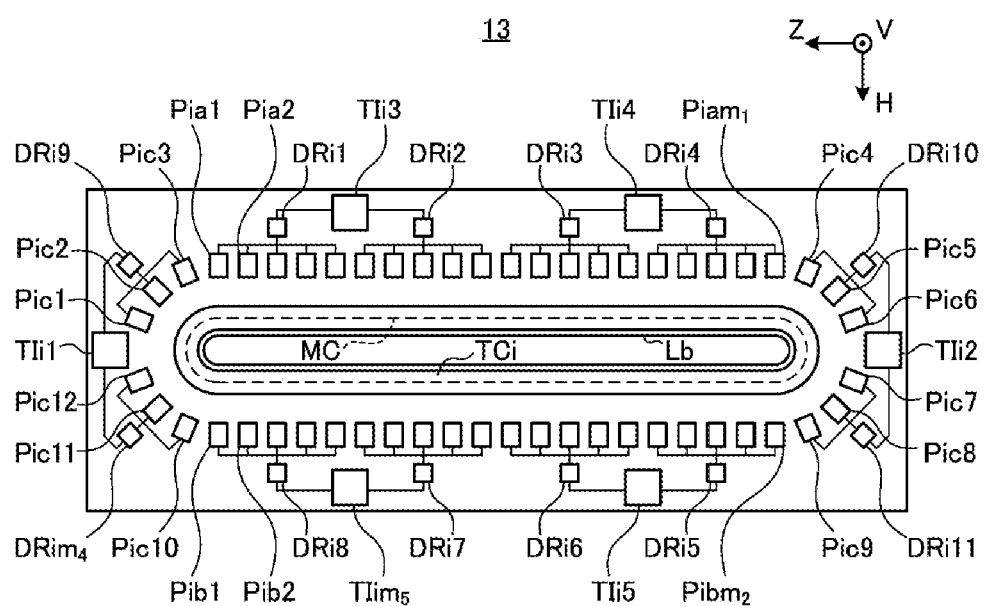
FIG. 13 is a plan view showing a state in which the pulse power module 13 of a fourth embodiment of the present disclosure is arranged on the laser chamber 10.

FIG. 13 is a plan view showing a state in which the pulse power module 13 of a fourth embodiment of the present disclosure is arranged on the laser chamber 10.

In the third embodiment, $m_4$ is 8 and $m_5$ is 2, while in the fourth embodiment, $m_4$ is 12 and $m_5$ is 6. That is, the pulse generation units $Pia1$ to $Piam_1$, $Pib1$ to $Pibm_2$, and $Pic1$ to $Pic12$ are divided into 12 groups, and the switch drive signal is transmitted from the 12 switch drive units $DRi1$ to $DRim_4$ to the 12 groups, respectively. In addition, the 12 switch drive units $DRi1$ to $DRim_4$ are divided into 6 groups, and the trigger signal is provided from the 6 trigger input units $TIi1$ to $TIim_5$ to the 6 groups, respectively.

Therefore, it is possible to reduce variations in the pulse generating timing among the pulse generation units $Pia1$ to $Piam_1$, $Pib1$ to $Pibm_2$, and $Pic1$ to $Pic12$.

In other respects, the fourth embodiment is similar to the third embodiment.

6. Pulse Power Module Including Divided Substrate

Figure 14:
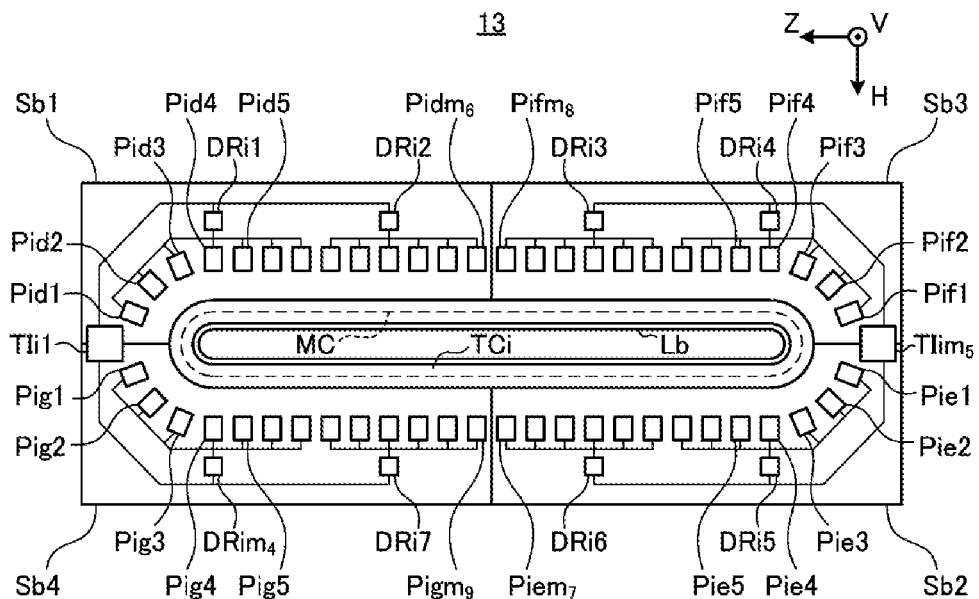
FIG. 14 is a plan view showing a state in which the pulse power module 13 of a fifth embodiment of the present disclosure is arranged on the laser chamber 10.

FIG. 14 is a plan view showing a state in which the pulse power module 13 of a fifth embodiment of the present disclosure is arranged on the laser chamber 10.

In the fifth embodiment, one primary electric circuit Eai and one transformer core TCi are mounted on first to fourth substrates Sb1 to Sb4.

Here, m pulse generation units included in the primary electric circuit Eai includes $m_6$ pulse generation units $Pid1$ to $Pidm_1$ mounted on the first substrate Sb1, and $m_7$ pulse generation units $Pie1$ to $Piem_7$ mounted on the second substrate Sb2. The first substrate Sb1 and the second substrate Sb2 have substantially the same shape. By mounting one primary electric circuit Eai and one transformer core TCi on a plurality of substrates, it is possible to avoid the use of a large-area substrate and reduce the procurement cost of the substrate. In addition, by using a plurality of substrates having substantially the same shape, the unit cost of the substrates can be reduced.

Here, $m_6$ and $m_7$ are the same number. Further, $m_6$ pulse generation units $Pid1$ to $Pidm_6$ and $m_7$ pulse generation units $Pie1$ to $Piem_7$ are mounted on the first substrate Sb1 and the second substrate Sb2 in the same arrangement, respectively. Thus, the manufacturing steps of the first substrate Sb1 and the second substrate Sb2 can be unified, and the manufacturing cost can be reduced. Further, the first substrate Sb1 on which $m_6$ pulse generation units $Pid1$ to $Pidm_6$ are mounted and the second substrate Sb2 on which $m_7$ pulse generation units $Pie1$ to $Piem_7$ are mounted can be made common as replacement parts.

Here, m pulse generation units included in the primary electric circuit Eai further include $m_8$ pulse generation units $Pif1$ to $Pifm_8$ mounted on the third substrate Sb3, and $m_9$ pulse generation units $Pig1$ to $Pigm_9$ mounted on the fourth substrate Sb4. The third substrate Sb3 is substantially mirror symmetrical to the first substrate Sb1. The third substrate Sb3 and the fourth substrate Sb4 have substantially the same shape. By mounting the primary electric circuit Eai and the transformer core TCi on 4 or more substrates, it is possible to avoid the use of a large-area substrate and reduce the procurement cost of the substrate. Further, even when using a plurality of substrates having a substantially mirror-symmetrical shape, by using the substrate of the same shape with the front and back sides thereof reversed, the unit cost of the substrate can be reduced.

Here, $m_8$ and $m_9$ are the same number. Further, $m_8$ pulse generation units Pif1 to Pifm$_8$ and $m_9$ pulse generation units Pig1 to Pigm$_9$ are mounted on the third substrate Sb3 and the fourth substrate Sb4 in the same arrangement, respectively. Accordingly, it is possible to obtain the same effect as in the case of unifying the arrangement of the elements in the first substrate Sb1 and the second substrate Sb2.

In the fifth embodiment, an example is shown in which the substrate on which the primary electric circuit Eai and the transformer core TCi are mounted is divided into 4 substrates Sb1 to Sb4, but the present disclosure is not limited thereto. A similar effect can be obtained by dividing a substrate into 2 or more substrates having the same shape or mirror-symmetrical shapes.

In other respects, the fifth embodiment is similar to the third embodiment or the fourth embodiment.

7. Others

Figure 15:
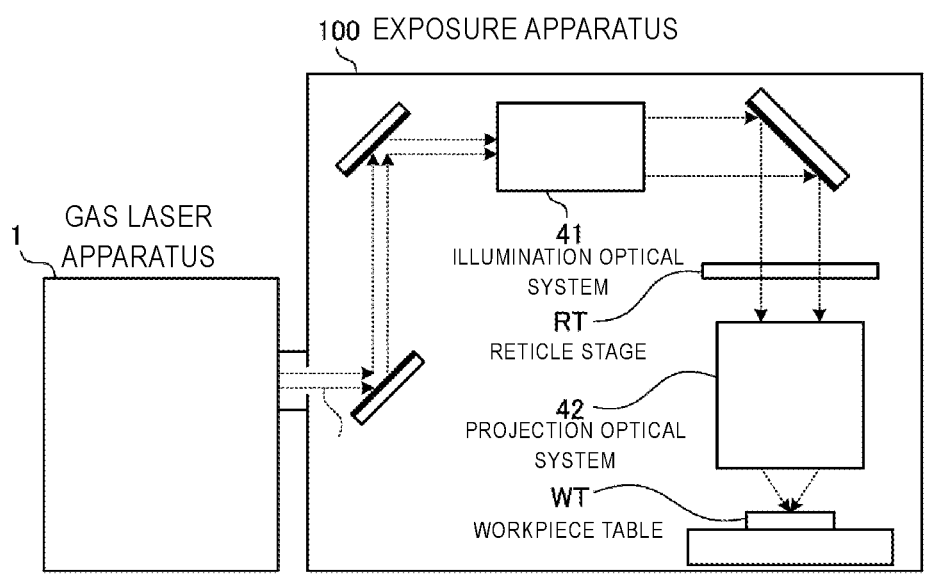
FIG. 15 schematically shows the configuration of an exposure apparatus 100 connected to the gas laser apparatus 1.

FIG. 15 schematically shows the configuration of the exposure apparatus 100 connected to the gas laser apparatus 1. As described above, the gas laser apparatus 1 generates laser light and emits the laser light to the exposure apparatus 100.

In FIG. 15, the exposure apparatus 100 includes an illumination optical system 41 and a projection optical system 42. The illumination optical system 41 illuminates a reticle pattern of a reticle stage RT with the laser light incident from the gas laser apparatus 1. The projection optical system 42 causes the laser light transmitted through the reticle to be imaged as being reduced and projected on a workpiece (not shown) arranged on a workpiece table WT. The workpiece is a photosensitive substrate such as a semiconductor wafer on which photoresist is applied. The exposure apparatus 100 synchronously translates the reticle stage RT and the workpiece table WT to expose the workpiece to the laser light reflecting the reticle pattern. Through the exposure process as described above, a device pattern is transferred onto the semiconductor wafer, thereby an electronic device can be manufactured.

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious to those skilled in the art that embodiments of the present disclosure would be appropriately combined.

The terms used throughout the present specification and the appended claims should be interpreted as non-limiting terms unless clearly described. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of any thereof and any other than A, B, and C.

What is claimed is:

1. A high voltage pulse generation device for applying a pulse high voltage between a pair of discharge electrodes arranged in a laser chamber of a gas laser apparatus, comprising:
    n transformer cores configuring a transformer, n being a natural number of 2 or more, each of the n transformer cores being configured to form a magnetic circuit along a first plane and to have a width in a first direction parallel to the first plane larger than a width in a second direction parallel to the first plane and perpendicular to the first direction;
    n primary electric circuits of the transformer connected in parallel to each other, n being a natural number of 2 or more, each of the n primary electric circuits including at least one primary coil, and m pulse generation units connected in parallel to the at least one primary coil, m being a natural number equal to or more than 2; and
    a secondary electric circuit of the transformer including a secondary coil and connected to the pair of discharge electrodes.

2. The high voltage pulse generation device according to claim 1,
    wherein the transformer core is arranged such that the first direction is parallel to a longitudinal direction of the discharge electrodes.

3. The high voltage pulse generation device according to claim 1,
    wherein the transformer core has a racetrack shape.

4. The high voltage pulse generation device according to claim 1,
    wherein the transformer core includes first and second linear portions arranged along the first direction, a first curved portion connecting ends of the first and second linear portions on a side thereof in the first direction, and a second curved portion connecting ends of the first and second linear portions on the other side thereof in the first direction.

5. The high voltage pulse generation device according to claim 1,
    wherein the width of the transformer core in the first direction is larger than a length of the discharge electrodes in a longitudinal direction of the discharge electrodes.

6. The high voltage pulse generation device according to claim 1,
    wherein the secondary coil has a cylindrical shape having a through hole in a direction perpendicular to the first plane, and a width in the first direction being larger than a width in the second direction.

7. The high voltage pulse generation device according to claim 6,
    wherein each of the n transformer cores has a through hole, and
    the secondary coil is arranged to penetrate through the through hole of each of the n transformer cores, one end of the secondary coil being connected to a reference potential, and the other end of the secondary coil being connected to one discharge electrode of the pair of discharge electrodes.

8. The high voltage pulse generation device according to claim 6,
    wherein a gap between each of the n transformer cores and the secondary coil is equal to or smaller than 5 mm.

9. The high voltage pulse generation device according to claim 1,
wherein the m pulse generation units are arranged outside the magnetic circuit.

10. The high voltage pulse generation device according to claim 1,
wherein the m pulse generation units include $m_1$ pulse generation units arranged side by side in the first direction and $m_2$ pulse generation units arranged side by side in the first direction, $m_1$ and $m_2$ each being a natural number, and
the $m_1$ pulse generation units are arranged on a side opposite to the $m_2$ pulse generation units with respect to the transformer core.

11. The high voltage pulse generation device according to claim 10,
wherein the m pulse generation units further include $m_3$ pulse generation units arranged side by side in a direction different from the first direction, $m_3$ being a natural number, and
a first gap between the $m_1$ pulse generation units and a second gap between the $m_2$ pulse generation units are both smaller than a third gap between the $m_3$ pulse generation units.

12. The high voltage pulse generation device according to claim 1,
wherein each of the m pulse generation units includes a capacitor and a switch connected in series to the capacitor.

13. The high voltage pulse generation device according to claim 12,
wherein each of the n primary electric circuits further includes $m_4$ switch drive units for providing a switch drive signal to the m pulse generation units, $m_4$ being a natural number equal to or more than 2 and equal to or less than m.

14. The high voltage pulse generation device according to claim 13,
wherein each of the n primary electric circuits further includes $m_5$ trigger input units for providing a trigger signal to the $m_4$ switch drive units, $m_5$ being a natural number equal to or more than 2 and equal to or less than $m_4$.

15. The high voltage pulse generation device according to claim 14,
wherein each of the $m_5$ trigger input units is a converter that converts an optical signal into an electric signal.

16. The high voltage pulse generation device according to claim 1,
wherein the m pulse generation units include $m_6$ pulse generation units mounted on a first substrate and $m_7$ pulse generation units mounted on a second substrate having the same shape as the first substrate, $m_6$ and $m_7$ each being a natural number.

17. The high voltage pulse generation device according to claim 16,
wherein me and my are the same number, and the me pulse generation units and the $m_7$ pulse generation units are mounted in the same arrangement on the first substrate and the second substrate, respectively.

18. The high voltage pulse generation device according to claim 17,
wherein the m pulse generation units further include ms pulse generation units mounted on a third substrate having a shape mirror symmetrical to the first substrate and $m_9$ pulse generation units mounted on a fourth substrate having the same shape as the third substrate, $m_8$ and $m_9$ being the same number and each being a natural number, and the ms pulse generation units and the $m_9$ pulse generation units are mounted on the third substrate and the fourth substrate, respectively, in the same arrangement.

19. A gas laser apparatus, comprising:
a laser chamber;
a pair of discharge electrodes arranged in the laser chamber; and
a high voltage pulse generation device configured to apply a pulse high voltage between the pair of discharge electrodes,
the high voltage pulse generation device including:
n transformer cores configuring a transformer, n being a natural number of 2 or more, each of the n transformer cores being configured to form a magnetic circuit along a first plane and to have a width in a first direction parallel to the first plane larger than a width in a second direction parallel to the first plane and perpendicular to the first direction;
n primary electric circuits of the transformer connected in parallel to each other, n being a natural number of 2 or more, each of the n primary electric circuits including at least one primary coil, and m pulse generation units connected in parallel to the at least one primary coil, m being a natural number equal to or more than 2; and
a secondary electric circuit of the transformer including a secondary coil and connected to the pair of discharge electrodes.

20. An electronic device manufacturing method, comprising:
generating pulse laser light using a gas laser apparatus;
emitting the pulse laser light to an exposure apparatus; and
exposing a photosensitive substrate to the pulse laser light in the exposure apparatus to manufacture an electronic device,
the gas laser apparatus, including:
a laser chamber;
a pair of discharge electrodes arranged in the laser chamber; and
a high voltage pulse generation device configured to apply a pulse high voltage between the pair of discharge electrodes, and
the high voltage pulse generation device including:
n transformer cores configuring a transformer, n being a natural number of 2 or more, each of the n transformer cores being configured to form a magnetic circuit along a first plane and to have a width in a first direction parallel to the first plane larger than a width in a second direction parallel to the first plane and perpendicular to the first direction;
n primary electric circuits of the transformer connected in parallel to each other, n being a natural number of 2 or more, each of the n primary electric circuits including at least one primary coil, and m pulse generation units connected in parallel to the at least one primary coil, m being a natural number equal to or more than 2; and
a secondary electric circuit of the transformer including a secondary coil and connected to the pair of discharge electrodes.

* * * * *